United States Patent
Qin et al.

(10) Patent No.: US 11,556,616 B2
(45) Date of Patent: Jan. 17, 2023

(54) METHODS TO TOLERATE PROGRAMMING AND RETENTION ERRORS OF CROSSBAR MEMORY ARRAYS

(71) Applicant: SanDisk Technologies LLC, Addison, TX (US)

(72) Inventors: Minghai Qin, Milpitas, CA (US);
Pi-Feng Chiu, Milpitas, CA (US); Wen Ma, Sunnyvale, CA (US); Won Ho Choi, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 573 days.

(21) Appl. No.: 16/655,575

(22) Filed: Oct. 17, 2019

(65) Prior Publication Data
US 2021/0117499 A1 Apr. 22, 2021

(51) Int. Cl.
*G06F 17/16* (2006.01)
*G11C 11/22* (2006.01)
(Continued)

(52) U.S. Cl.
CPC .......... *G06F 17/16* (2013.01); *G11C 11/1657* (2013.01); *G11C 11/223* (2013.01); *G11C 11/2257* (2013.01); *G11C 11/2273* (2013.01); *G11C 11/2275* (2013.01); *G11C 13/0004* (2013.01); *G11C 13/004* (2013.01); *G11C 13/0011* (2013.01); *G11C 13/0028* (2013.01);
(Continued)

(58) Field of Classification Search
None
See application file for complete search history.

(56) References Cited

U.S. PATENT DOCUMENTS 5,255,227 A * 10/1993 Haeffele .............. G11C 29/848
365/201
5,491,444 A * 2/1996 McClure .............. G11C 29/785
326/50
(Continued)

OTHER PUBLICATIONS

Qin et al., "Methods to Tolerate Programming and Retention Errors of Crossbar Memory Arrays," U.S. Appl. No. 16/912,717, filed Jun. 26, 2020.
(Continued)

*Primary Examiner* — J. H. Hur
(74) *Attorney, Agent, or Firm* — Vierra Magen Marcus LLP

(57) ABSTRACT

Systems and methods for reducing the impact of defects within a crossbar memory array when performing multiplication operations in which multiple control lines are concurrently selected are described. A group of memory cells within the crossbar memory array may be controlled by a local word line that is controlled by a local word line gating unit that may be configured to prevent the local word line from being biased to a selected word line voltage during an operation; the local word line may instead be set to a disabling voltage during the operation such that the memory cell currents through the group of memory cells are eliminated. If a defect has caused a short within one of the memory cells of the group of memory cells, then the local word line gating unit may be programmed to hold the local word line at the disabling voltage during multiplication operations.

20 Claims, 14 Drawing Sheets

(51) Int. Cl.
    *G11C 11/16*       (2006.01)
    *G11C 13/00*       (2006.01)
(52) U.S. Cl.
    CPC ............... *G11C 13/0069* (2013.01); *G11C 2013/0045* (2013.01); *G11C 2207/063* (2013.01); *G11C 2213/71* (2013.01); *G11C 2213/79* (2013.01)

(56) References Cited

U.S. PATENT DOCUMENTS

| | | | |
|---|---|---|---|
| 2009/0154225 A1 | 6/2009 | Hidaka | |
| 2014/0226417 A1 | 8/2014 | Lai | |
| 2015/0187397 A1 | 7/2015 | Hsu et al. | |
| 2017/0270978 A1 | 9/2017 | Loibl | |
| 2019/0019564 A1* | 1/2019 | Li | H01L 45/085 |

OTHER PUBLICATIONS

PCT International Search Report dated Jul. 8, 2020, PCT Patent Application No. PCT/US2020/025569.
PCT Written Opinion of the International Searching Authority dated Jul. 8, 2020, PCT Patent Application No. PCT/US2020/025569.
International Preliminary Report on Patentability dated Apr. 28, 2022, International Application No. PCT/US2020/025569.
First Action Interview Pilot Program Pre-Interview Communication dated Jun. 6, 2022, U.S. Appl. No. 16/912,717, filed Jun. 26, 2020.
First Action Interview Office Action Summary dated Jul. 27, 2022, U.S. Appl. No. 16/912,717, filed Jun. 26, 2020.

\* cited by examiner $$\begin{Bmatrix} I_1 \\ I_2 \\ \vdots \\ I_m \end{Bmatrix} = \begin{bmatrix} G_{11} & G_{12} & \cdots & G_{1m} \\ G_{21} & G_{22} & \cdots & G_{2m} \\ \vdots & \vdots & \ddots & \vdots \\ G_{n1} & G_{n2} & \cdots & G_{nm} \end{bmatrix} \begin{Bmatrix} V_1 \\ V_2 \\ \vdots \\ V_n \end{Bmatrix}$$

207

$$I_j = \sum G_{ij} V_i$$

$$8\frac{1V}{10K\Omega} + 4\frac{1V}{1M\Omega} + 2\frac{1V}{10K\Omega} + 1\frac{1V}{1M\Omega} = 1.005mA$$
513

$$8\frac{1V}{10K\Omega} + 4\frac{1V}{1\Omega} + 2\frac{1V}{10K\Omega} + 1\frac{1V}{1M\Omega} = 4A$$
514

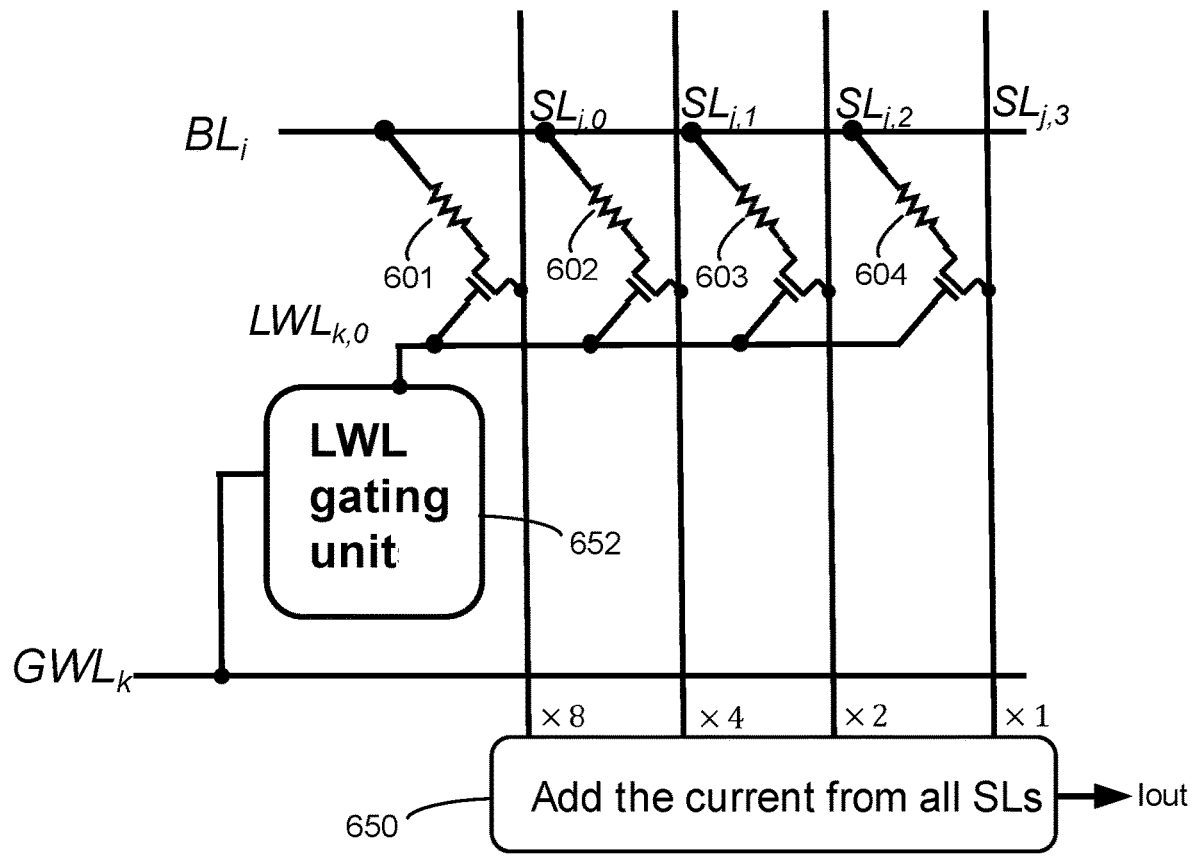
FIG. 6A
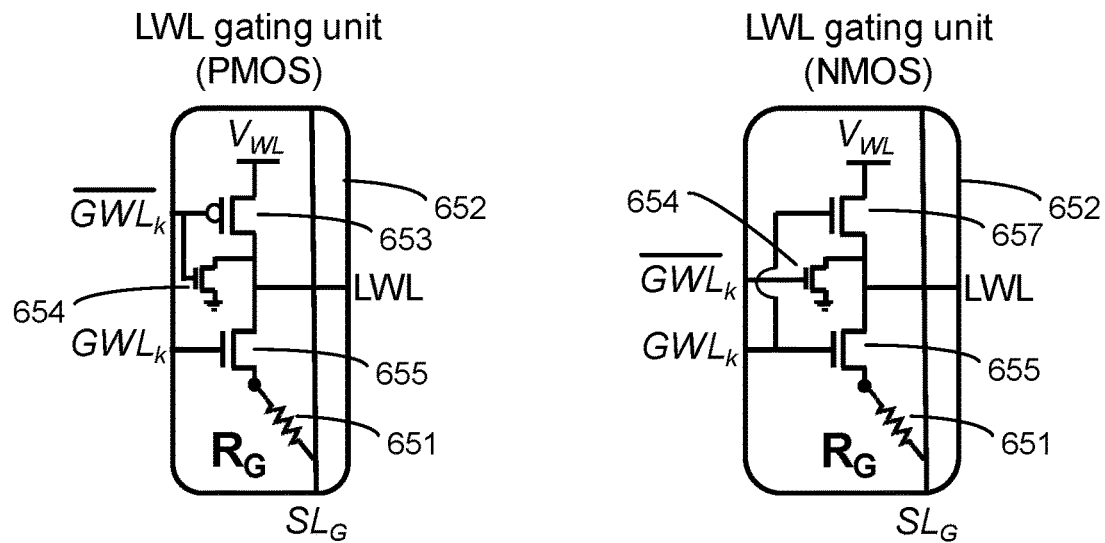
FIG. 6B  FIG. 6C

METHODS TO TOLERATE PROGRAMMING AND RETENTION ERRORS OF CROSSBAR MEMORY ARRAYS

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include resistive RAM (e.g., ReRAM), flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics over process, voltage, and temperature variations.

A non-volatile memory device may include a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. In some cases, each memory cell in a cross-point memory array may be placed in series with a selector element or an isolation element, such as a diode or threshold switch, in order to reduce leakage currents. In cross-point memory arrays where the memory cells do not include an isolation element, controlling and minimizing leakage currents may be a significant issue, especially since leakage currents may vary greatly over biasing voltage and temperature.

BRIEF DESCRIPTION OF THE DRAWINGS

FIG. 6A depicts one embodiment of a group of memory cells corresponding with a node and a local word line gating unit.

FIGS. 6B-6C depict various embodiments of a local word line gating unit.

DETAILED DESCRIPTION

Figure 1A:
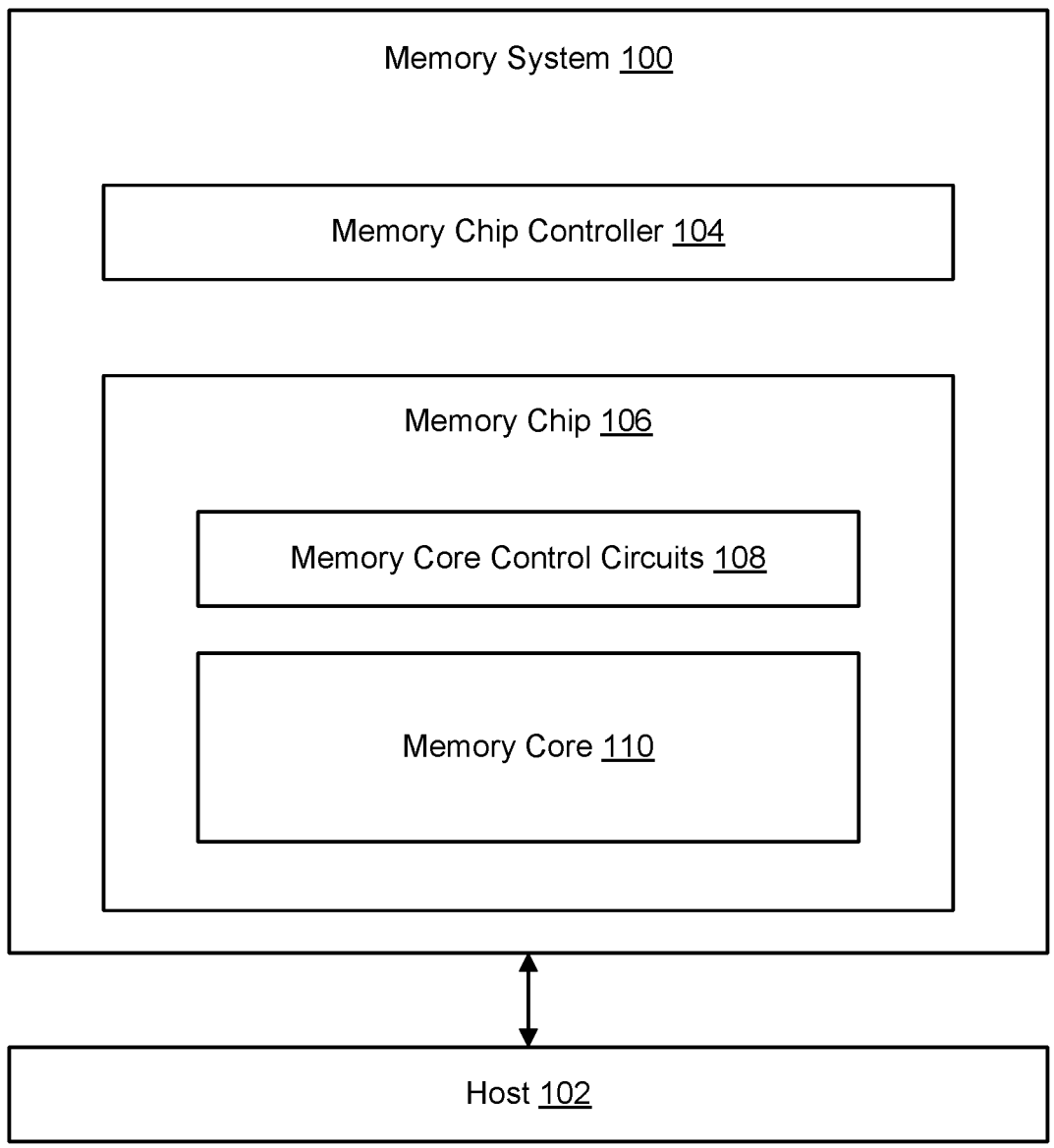
FIG. 1A depicts one embodiment of a memory system and a host.

Technology is described for reducing the impact of defects within a crossbar memory array (or a cross-point memory array) when performing operations in which multiple control lines (e.g., multiple word lines) are concurrently selected within the crossbar memory array. One example of an operation in which multiple control lines are concurrently selected is a matrix multiplication operation in which a plurality of word lines (e.g., all the word lines within the memory array) are selected such that the memory cell access transistors or memory cell elements connected to the word lines are concurrently set into a conducting state. In this case, memory cell currents from a plurality of memory cells within the memory array may be aggregated and a data value may be output based on the aggregation or summation of the memory cell currents. The memory cell currents that are aggregated may be first multiplied by different powers of two prior to being aggregated. For example, a first current flowing through a first memory cell of the plurality of memory cells may be multiplied by two and a second current flowing through a second memory cell of the plurality of memory cells may be multiplied by four prior to being combined.

In some cases, a group of memory cells may be controlled by a local word line (LWL), such as a local word line that is connected to the gates of memory cell transistors corresponding with the group of memory cells or a local word line that is connected to the gates of transistors that are in series with the group of memory cells. The local word line may be controlled by a local word line gating unit that may be configured to prevent the local word line from being biased to a selected word line voltage during an operation (e.g., a matrix multiplication operation); the local word line may be instead set to a disabling voltage during the operation such that the memory cell currents through the group of memory cells are minimized or eliminated. In one embodiment, if a manufacturing defect has caused a short within one of the memory cells of the group of memory cells, then the local word line gating unit may be programmed to prevent the local word line from being biased to the selected word line voltage or to remain in a disabling state during matrix multiplication operations. The technical benefits of identifying defects within a crossbar memory array and configuring local word line gating units to disable local word lines that would otherwise set defective memory cells into conducting states or permit currents from shorts to be aggregated include increased error tolerance and reduced power consumption. Another technical benefit is that the amount of data alteration due to currents associated shorts being aggregated with memory cell currents may be reduced or limited.

In some embodiments, the local word line gating unit (or local word line gating circuit) may include a non-volatile memory element (e.g., a programmable resistor or a floating gate transistor) that is programmed in order to enable or disable the ability for a local word line controlled by the local word line gating unit to be biased to a selected word line voltage during a memory array operation. In one example, the local word line gating unit may be programmed to output a deselected word line voltage (e.g., 0V) instead of a selected word line voltage (e.g., 3V) when the local word line is to be selected during a matrix multiplication operation or other memory array operation in which multiple memory cell currents are aggregated. In other embodiments, the local word line gating unit may include a volatile memory element. For example, the local word line gating unit may include a flip-flop or a latch circuit that temporarily stores a configuration of the local word line gating unit. In this case, prior to a matrix multiplication operation being performed using the crossbar memory array, the volatile memory element may be programmed to either enable selection of a local word line connected to a group of memory cells or to disable the ability to select the group of memory cells.

In some embodiments, the local word line gating unit may include an analog multiplexor for passing a particular bias voltage during an operation when the local word line gating unit is set into a disabling state. In one example, if the local word line gating unit is not set into the disabling state, then the local word line controlled by the local word line gating unit will either pass a selected word line voltage (e.g., 3V) during matrix multiplication operations or an unselected word line voltage (e.g., 0V) when the local word line is unselected; however, if the local word line gating unit is set into the disabling state, then the local word line controlled by the local word line gating unit will either pass the particular bias voltage (e.g., 100 mV) during matrix multiplication operations or the unselected word line voltage (e.g., 0V) when the local word line is unselected. A voltage regulator may be used to generate the particular bias voltage, which is then distributed to one or more local word line gating units.

The identification of defects, such as word line shorts or shorts within particular memory cells within a memory array, may be performed during wafer sort or prior to shipment of a die that includes the crossbar memory array. In some cases, one or more control circuits arranged on the die may perform periodic testing of the crossbar memory array in order to detect the presence of new defects, such a short that becomes more pronounced over time. In one example, to test for new shorts, all memory cells within the crossbar memory array may be programmed or set to a default resistance value (e.g., a high resistance value) and a new defect may be detected if the aggregate current outputted from a group of memory cells within the memory array is greater than a threshold amount of current (e.g., is greater than 0.5 mA). Once the new defect is detected, the local word line gating unit may be programmed in order to disable the group of memory cells during subsequent operations.

Neuromorphic computing based deep learning is one way to lower power cost by using crossbar memory arrays to compute matrix multiplication. Matrix-vector multiplications may be implemented using voltage/current passing crossbar memory arrays with various weights represented by binary arrays that are programmed to the crossbar memory array. In one embodiment, vector/vector multiplication (e.g., vector dot product) is performed in a non-volatile memory system. A vector dot product is the summation of the products of the corresponding elements of two equal length vectors (where equal length refers to an equal number of elements). A vector dot product may also be referred to as a "multiply and accumulate" (MAC). In one embodiment, vector/matrix multiplication is performed in a non-volatile memory system. In one embodiment, non-volatile memory cells are used to perform multiplication in a neuromorphic computing system. A neuromorphic computing system may be used to implement an artificial neural network.

In one embodiment, a multiplicand may be stored in a node that comprises multiple non-volatile memory cells. Each memory cell in the node may be programmed to one of two physical states. A physical state may comprise a high current on-state or a lower current off-state. One state may be used to store a "1" and the other to store a "0." Thus, it may be stated that each memory cell stores one bit of information. In one embodiment, each non-volatile memory cell stores a different digit of the multiplicand in a binary number system. In one embodiment, the memory cells in the nodes are "binary non-volatile memory cells." A "binary non-volatile memory cell," as the term is defined herein, is a non-volatile memory cell that can be repeatedly switched between only two physical states. This is in contrast to a "multi-state non-volatile memory cell" which, as the term is defined herein, may be repeatedly switched between more than two physical states.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate.

FIG. 1A depicts one embodiment of a memory system 100 and a host 102.

Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102. In one embodiment, memory system 100 is used as a neuromorphic computing system.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, matrix multiplication, programming, or reading (or sensing) operations. The managing or control circuits may be used to perform multiplication using non-volatile memory cells.

In some embodiments, the managing or control circuits (or a portion of the managing or control circuits) for facilitating one or more memory array operations (including multiplication) may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, or generating row and column addresses. Memory core control circuits 108 may include logic for controlling the generation of voltage references for biasing a particular memory array in order to perform multiplication using non-volatile memory cells.

Memory chip controller 104 controls operation of memory chip 106. Once a read, write, or multiply operation is initiated by memory chip controller 104, memory core control circuits 108 may generate the appropriate bias voltages for bit lines, source lines and/or word lines within memory core 110, and generate the appropriate memory block, row, and column addresses.

In some embodiments, one or more managing or control circuits may be used for controlling the operation of a memory array. The one or more managing or control circuits may provide control signals to a memory array to perform a read operation, a write operation and/or a multiply operation on the memory array. In one example, the one or more managing or control circuits may include any one of or a combination of control circuitry, state machine, decoders, sense amplifiers, read/write/multiply circuits, and/or controllers. The one or more managing circuits may perform or facilitate one or more memory array operations including erasing, programming, reading operations, or multiply operations. In one example, one or more managing circuits may include an on-chip memory controller for determining row and column address, bit line, source line and word line addresses, memory array enable signals, and data latching signals.

Memory core 110 may include one or more two-dimensional arrays of memory cells or one or more three-dimensional arrays of memory cells. In one embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

In one embodiment, memory core 110 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate.

The exact type of memory array architecture or memory cell included in memory core 110 is not limited to the examples above. Many different types of memory array architectures or memory technologies can be used to form memory core 110. No particular non-volatile memory technology is required for purposes of the embodiments described herein. Other examples of suitable technologies for memory cells of the memory core 110 include ReRAM memories, ferroelectric field effect transistor (FeFET) memory, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory core 110 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A ferroelectric field effect transistor (FeFET) memory has an adjustable threshold voltage (Vt) transistor that has an adjustable threshold voltage. The adjustable Vt transistor has a low threshold voltage state and a high threshold voltage state, in one embodiment. The adjustable Vt transistor can be repeatedly switched between the low threshold voltage state and the high threshold voltage state.

A person of ordinary skill in the art will recognize that the technology described herein is not limited to a single specific memory structure, but covers many relevant memory structures within the spirit and scope of the technology as described herein and as understood by one of ordinary skill in the art.

Figure 1B:
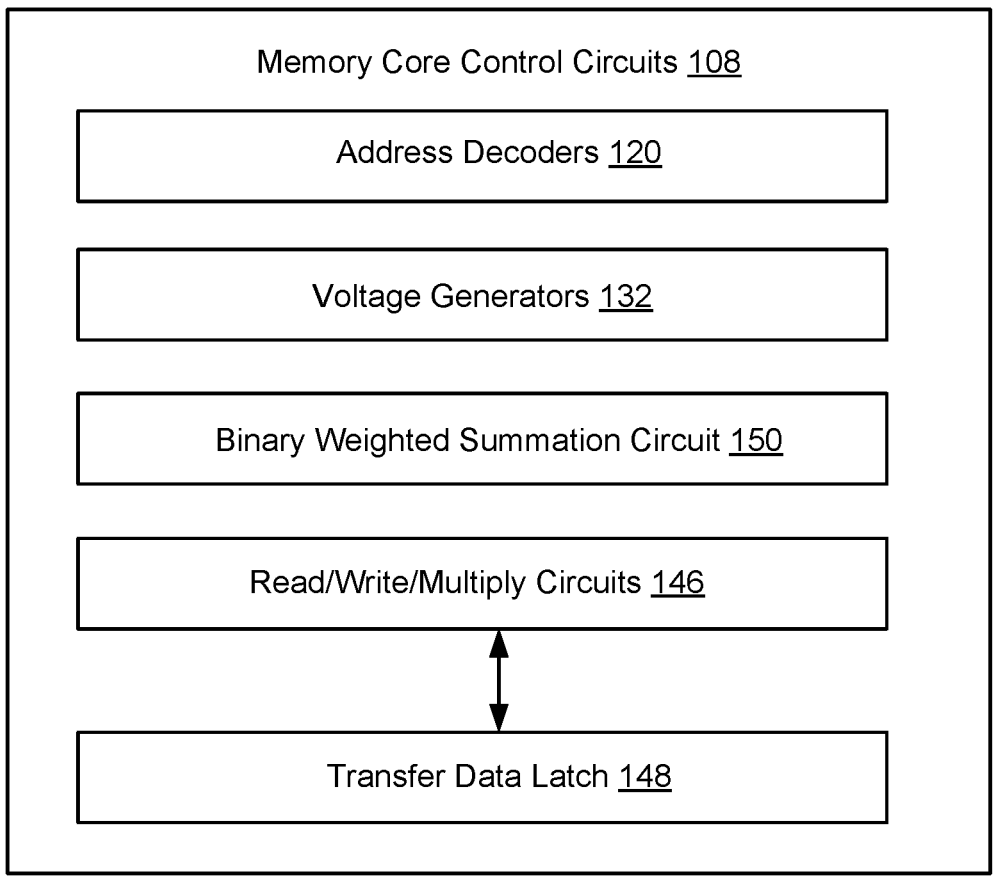
FIG. 1B depicts one embodiment of memory core control circuits.

FIG. 1B depicts one embodiment of memory core control circuits 108. As depicted, memory core control circuits 108 include address decoders 120, voltage generators 132, transfer data latch 148, read/write/multiply circuits 146, and binary weighted summation circuit 150. The voltage generators (or voltage regulators) 132 may generate voltages for control lines.

Read/write/multiply circuits 146 include circuitry for reading and writing memory cells in the memory core 110. In an embodiment, transfer data latch 148 is used for intermediate storage between memory chip controller 104 in FIG. 1A and memory cells. In an embodiment, when host 102 instructs memory chip controller 104 to write data to memory chip 106, memory chip controller 104 writes host data to transfer data latch 148. Read/write circuits 146 then write data from transfer data latch 148 to a specified page of memory cells. In an embodiment, transfer data latch 148 has a size equal to the size of a page. In an embodiment, when host 102 instructs memory chip controller 104 to read data from memory chip 106, read/write circuits 146 read from a specified page into transfer data latch 148, and memory chip controller 104 transfers the read data from transfer data latch 148 to host 102. Address decoders 120 may generate memory block addresses, as well as row addresses and column addresses for a particular memory block.

The read/write/multiply circuits 146 also include circuitry for performing multiply operations using memory cells. In one embodiment, the write circuit is used to store multiplicands in the memory cells. The write circuit stores a multiplicand into a node of "r" memory cells, in one embodiment. In one embodiment, the multiplicand has "r" bits. Each memory cell in a node stores one of the "r" bits of the multiplicand, in one embodiment.

In one embodiment, the multiply circuit is used to apply multiply voltages to memory cells that store multiplicands. Each multiply voltage has a magnitude that represents a multiplier, in one embodiment. Each memory cell in a node passes a memory cell current in response to the multiply voltage, in one embodiment. The magnitude of the memory cell current depends on the physical state of the memory cell and the magnitude of the multiply voltage, in one embodiment. For example, the magnitude of a memory cell current depends on the resistance of the memory cell and the voltage applied between two terminals of the memory cell, in one embodiment. The magnitude of the memory cell current depends on whether the memory cell is in a first physical state or a second physical state, in one embodiment. Each physical state may be represented by a physical parameter including, but not limited to, a memory cell resistance, or a memory cell transistor threshold voltage.

The multiply voltage may be similar in magnitude to a read voltage, in that the multiply voltage may cause the memory cell to pass the memory cell current without changing the physical state of the memory cell. However, whereas a read voltage may have a magnitude that is selected to delineate between physical states, the magnitude of the multiply voltage is not necessarily selected to delineate between physical states. The following examples of a memory cell programmed to one of two states will be used to illustrate. After a read voltage is applied, the memory cell current may be sensed and compared with a reference current to determine which state the memory cell is in. In this case, the magnitude of the read voltage and reference current may be selected to be able to delineate between the two states. However, the multiply voltage could have one of many different magnitudes, depending on what multiplier is desired. Moreover, the memory cell current that results from applying the multiply voltage is not necessarily compared to a reference current.

The binary weighted summation circuit 150 may be used during multiplication. The binary weighted summation circuit 150 is configured to process each of the memory cell currents from one or more nodes of memory cells. The binary weighted summation circuit 150 multiplies the magnitude of the memory cell current from each memory cell in a selected node by a different power of two to pass a multiplied signal for each memory cell, and sums the multiplied signals for the selected node, in one embodiment. Thus, the binary weighted summation circuit 150 may generate a summed signal that represents a product of the multiplier times a multiplicand stored in the selected node.

The binary weighted summation circuit 150 may also be used to generate a summed signal that represents a dot product of two vectors. A column of nodes is used to store elements of a first vector, in one embodiment. The column of nodes is associated with "r" bit lines, in one embodiment. Each node may have "r" non-volatile memory cells, wherein each bit line is associated with one memory cell in each of the nodes. The multiply circuit may simultaneously apply a different multiply voltage to each node. Each multiply voltage may correspond to an element of a second vector. The binary weighted summation circuit 150 may multiply the current in each bit line by a different power of two, and sum the multiplied currents in the "r" bit lines to generate a vector multiplication result signal that represents multiplication of the first vector by the second vector.

Figure 1C:
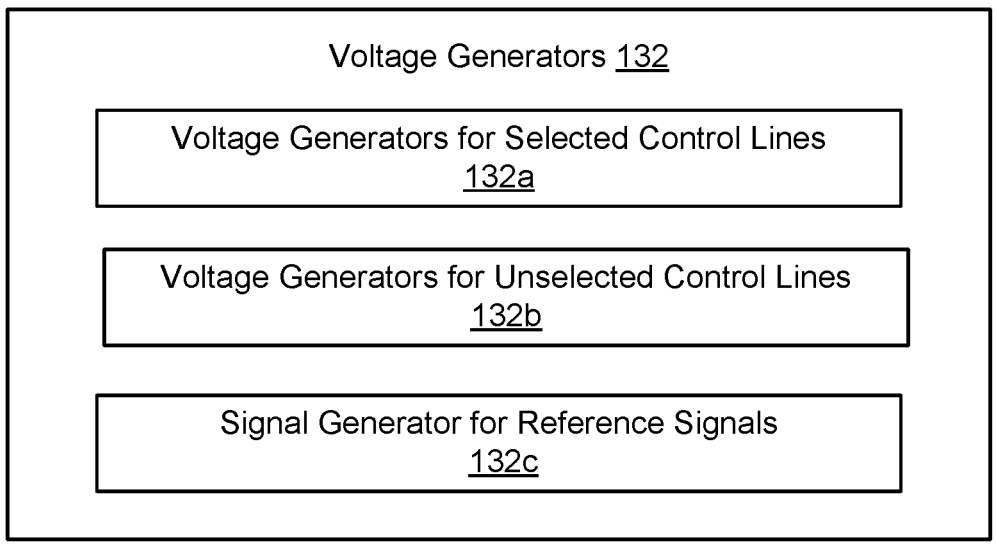
FIG. 1C depicts one embodiment of voltage generators.

FIG. 1C depicts one embodiment of voltage generators 132. The voltage generators include voltage generators for selected control lines 132a, voltage generators for unselected control lines 132b, and signal generators for reference signals 132c. Control lines may include bit lines, source lines and word lines, or a combination of bit lines, source lines and word lines. Voltage generators for selected control lines 132a may be used to generate program, read, and/or multiply voltages. In one embodiment, the voltage generators for selected control lines 132a generate a voltage whose magnitude is based on a multiplier for a mathematical multiplication operation. In one embodiment, the voltage difference between the voltages for two selected control lines is a multiply voltage. Voltage generators for unselected control lines 132b may be used to generate voltages for control lines that are connected to memory cells that are not selected for a program, read, or multiply operation. The signal generators for reference signals 132c may be used to generate reference signals (e.g., currents, voltages) to be used as a comparison signal to determine the physical state of a memory cell.

Figure 2A:
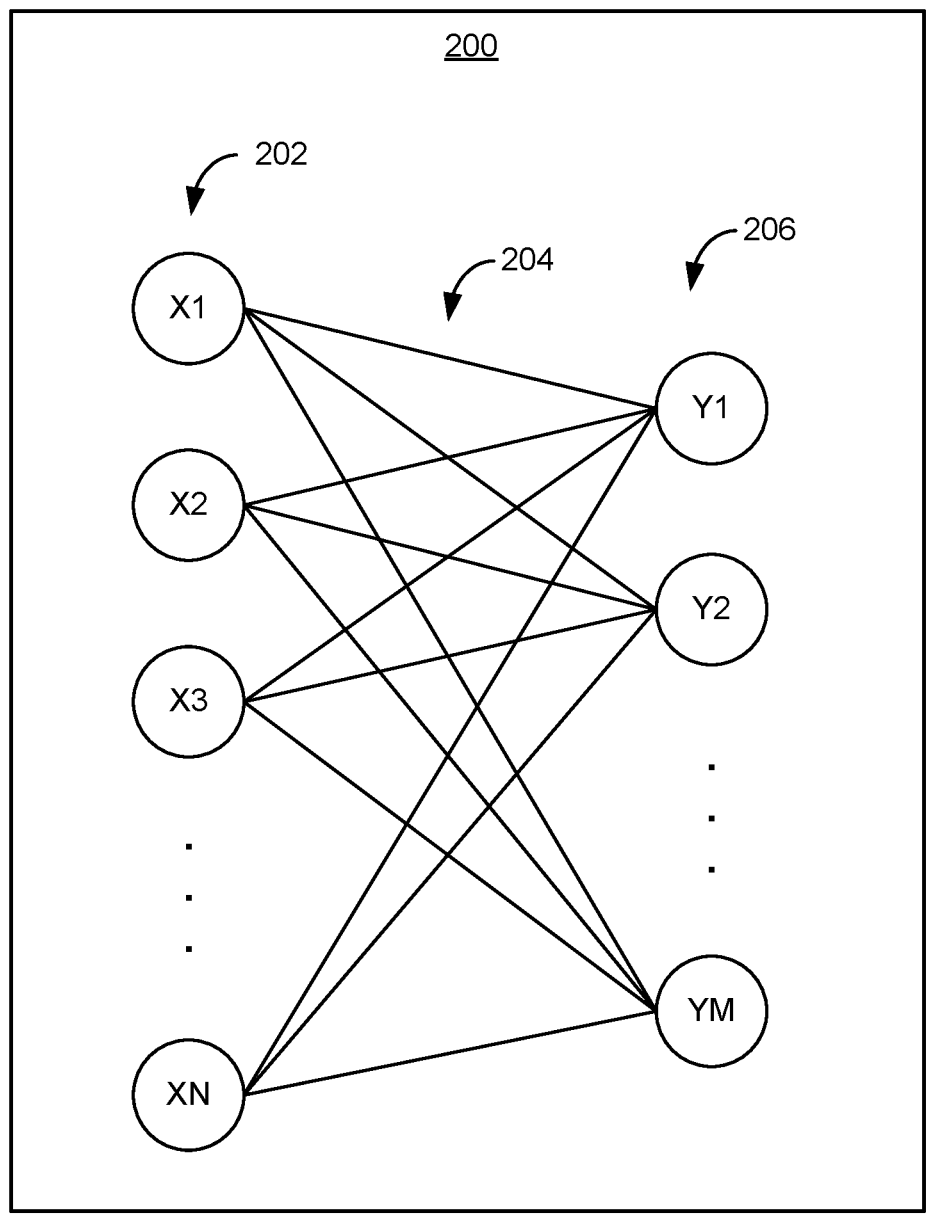
FIG. 2A depicts one embodiment of an N to M artificial neural network.

FIG. 2A depicts one embodiment of an N to M artificial neural network 200. The artificial neural network 200 has "N" input neurons 202 and "M" output neurons 206. A number of synapses 204 connect input neurons 202 to output neurons 206. Each of the input neurons 202 may be associated with a mathematical number. Likewise, each of the synapses 204 may be associated with a mathematical number, which is typically referred to as a "weight." Equation 1 represents a calculation that may be performed for each of the "M" output neurons 206.

$$Y_M = \sum_1^N X_N \times W_{NM} \quad \text{Eq. 1}$$

In Equation 1, $Y_M$ represents the output neuron 206 for which Equation 1 is presently being applied; $X_N$ represents the input neurons 202; and $W_{NM}$ represents the weight of the synapse 204 that connects one input neuron 202 to the output neuron 206 for which Equation 1 is presently being applied ($Y_M$). As noted above, each synapse has a "weight." Thus, Equation 1 may be implemented by a multiply and accumulate (MAC) of the product of the values of the N input neuron 202 by the weight of the synapse 204 that connects each respective input neuron 202 to $Y_M$. The multiply and accumulate can also be referred to as a vector/vector multiply (e.g., dot product of two vectors). The first vector being an "n" element vector defined by the values for the N input neuron 202, and the second vector being an "n" element vector defined by the weights of the N synapses 204 that connect the N input neurons 202 to $Y_M$. One technique for performing the multiply and accumulate (or vector/vector multiply) is to use a cross-point memory array.

Figure 2B:
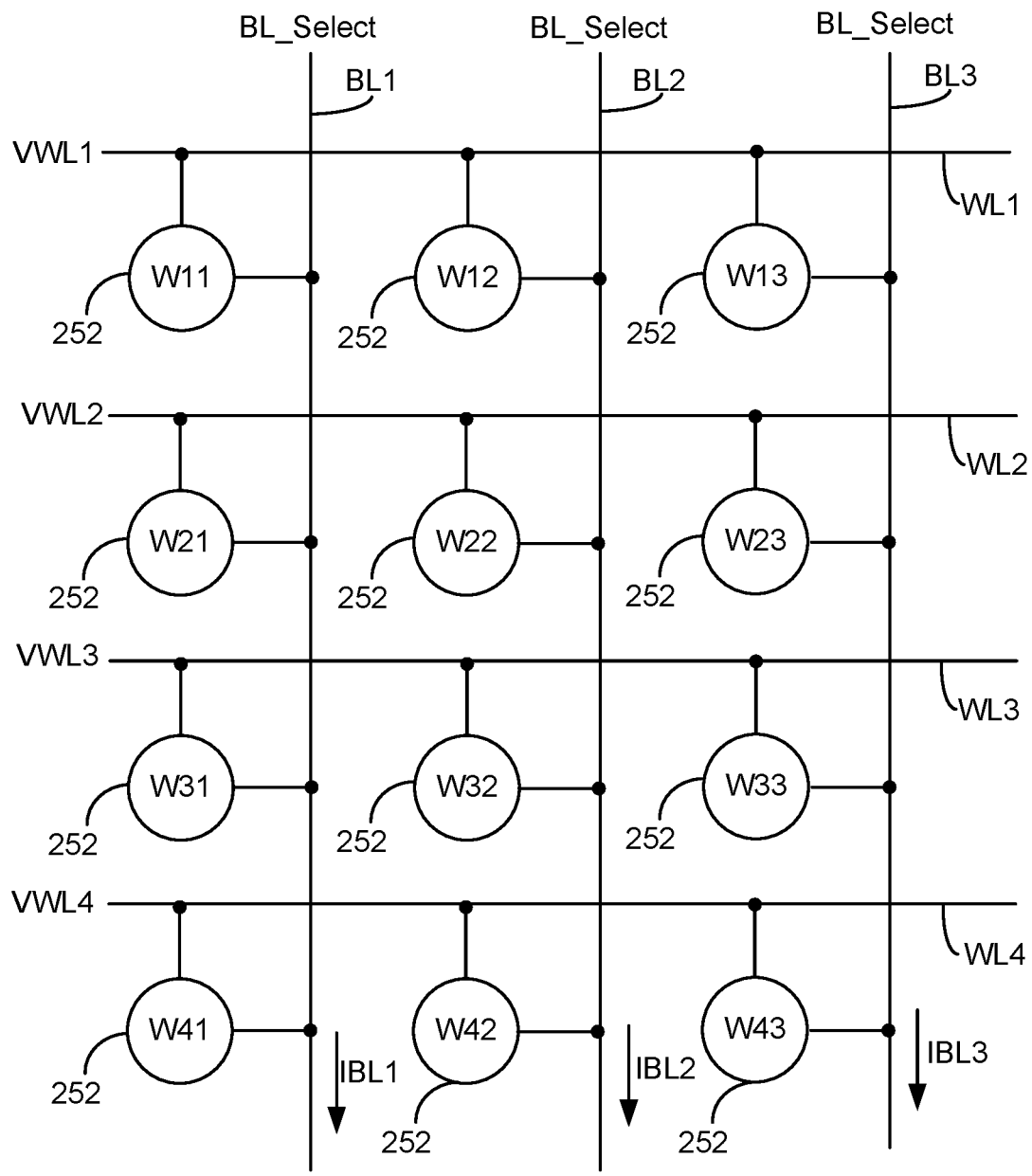
FIG. 2B depicts one embodiment of a portion of a cross-point memory array.

FIG. 2B depicts one embodiment of a portion of a cross-point memory array 250. The cross-point memory array 250 may be used to perform a multiply and accumulate operation. The depicted portion of the array 250 has four word lines (WL1, WL2, WL3, WL4) and three bit lines (BL1, BL2, BL3). The depicted portion of the array 250 may be used to execute Equation 1 for a case in which N=4 and M=3. A number of non-volatile memory cells 252 are depicted. Each non-volatile memory cell 252 could include an adjustable or programmable resistor, as one example. Each memory cell 252 is labeled with a weight (e.g., W11, W21, etc.). These weights ($W_{NM}$) correspond to the weights that represent the synapse 204 that connects one input neuron 202 to the output neuron 206. For some types of memory cells, the adjustable resistor can be programmed to a range of resistances. Thus, the weight may be related to the resistance of the adjustable resistor.

Voltages VWL1, VWL2, VWL3, and VWL4 are shown being applied to the respective word lines WL1, WL2, WL3, WL4. The magnitudes of these voltages correspond to the input neurons 202. Thus, the set of voltages VWL1, VWL2, VWL3, and VWL4 correspond to $X_N$ in Equation 1. A bit line select voltage (BL Select) is applied to each bit line to select that bit line. For ease of explanation, it will be assumed that BL Select is zero volts, such that the voltage across each memory cell 252 is the word line voltage. Each memory cell 252 may pass a current that is based on its resistance and the voltage applied to the memory cell. This "memory cell current" flows to the bit line connected to the memory cell 252. The memory cell current may be viewed as the product of multiplying a mathematical value represented by the word line voltage by a mathematical value represented by the resistance of the memory cell. Stated another way, the memory cell current may be viewed as a representation of the product of multiplying one of the elements of an input vector by the weight stored in the memory cell.

A number of bit line currents (IBL1, IBL2, IBL3) are depicted. Each bit line current is the summation of the currents of the memory cells connected to that bit line. Thus, each bit line current may be viewed as representing an accumulation of the products discussed in the prior paragraph. Therefore, the magnitude of a bit line current may be viewed to represent a vector/vector multiplication (e.g., dot product of two vectors). Furthermore, with reference to Equation 1, the magnitude of a bit line current may represent one of the output neurons (e.g., $Y_M$).

For the architecture in FIG. 2B, in order for the multiply and accumulate to be precise, the weights should be able to have a variety of values. However, some memory cells can only be reliably programmed to two states. Some memory cells can be programmed to more than two states. For example, some adjustable resistance memory cells can be programmed to more than two resistances. However, for such multi-state memory cells to pass precise MAC in the architecture in FIG. 2B, there should be a linear relationship between the resistance states. Unfortunately, many multi-state memory cells exhibit a non-linear relationship between the resistance states. Therefore, accuracy in MAC may be imprecise when such memory cells are used in the architecture in FIG. 2B.

Figures 2C, 2D:
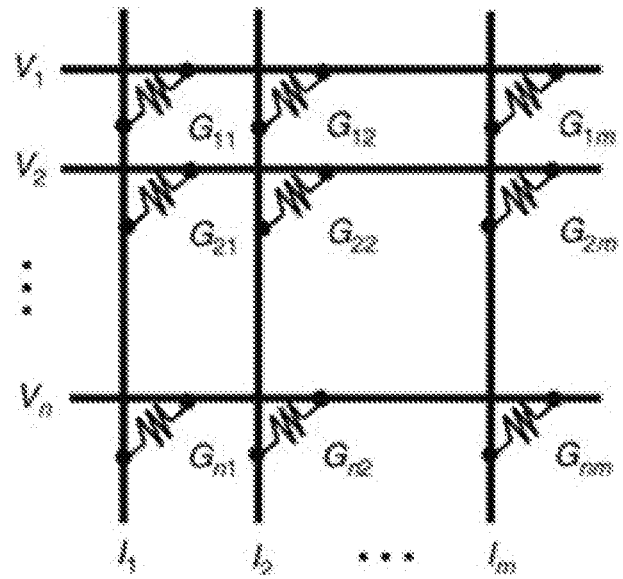
FIG. 2C depicts one embodiment of a crossbar memory array.
FIG. 2D depicts one embodiment of matrices corresponding with a matrix multiplication operation using the crossbar memory array of FIG. 2C.

FIG. 2C depicts one embodiment of a crossbar memory array with memory cells comprising adjustable resistors with conductances $G_{11}$ through $G_{nm}$, bit lines with output currents $I_1$ through $I_m$, and word lines biased to voltages $V_1$ through $V_n$ during a matrix multiplication operation.

FIG. 2D depicts one embodiment of matrices corresponding with a matrix multiplication operation using the crossbar memory array of FIG. 2C in which the word line voltages $V_1$ through $V_n$ are multiplied by columns within the conductance matrix 207 in order to generate the output currents $I_1$ through $I_m$.

Figure 3A:
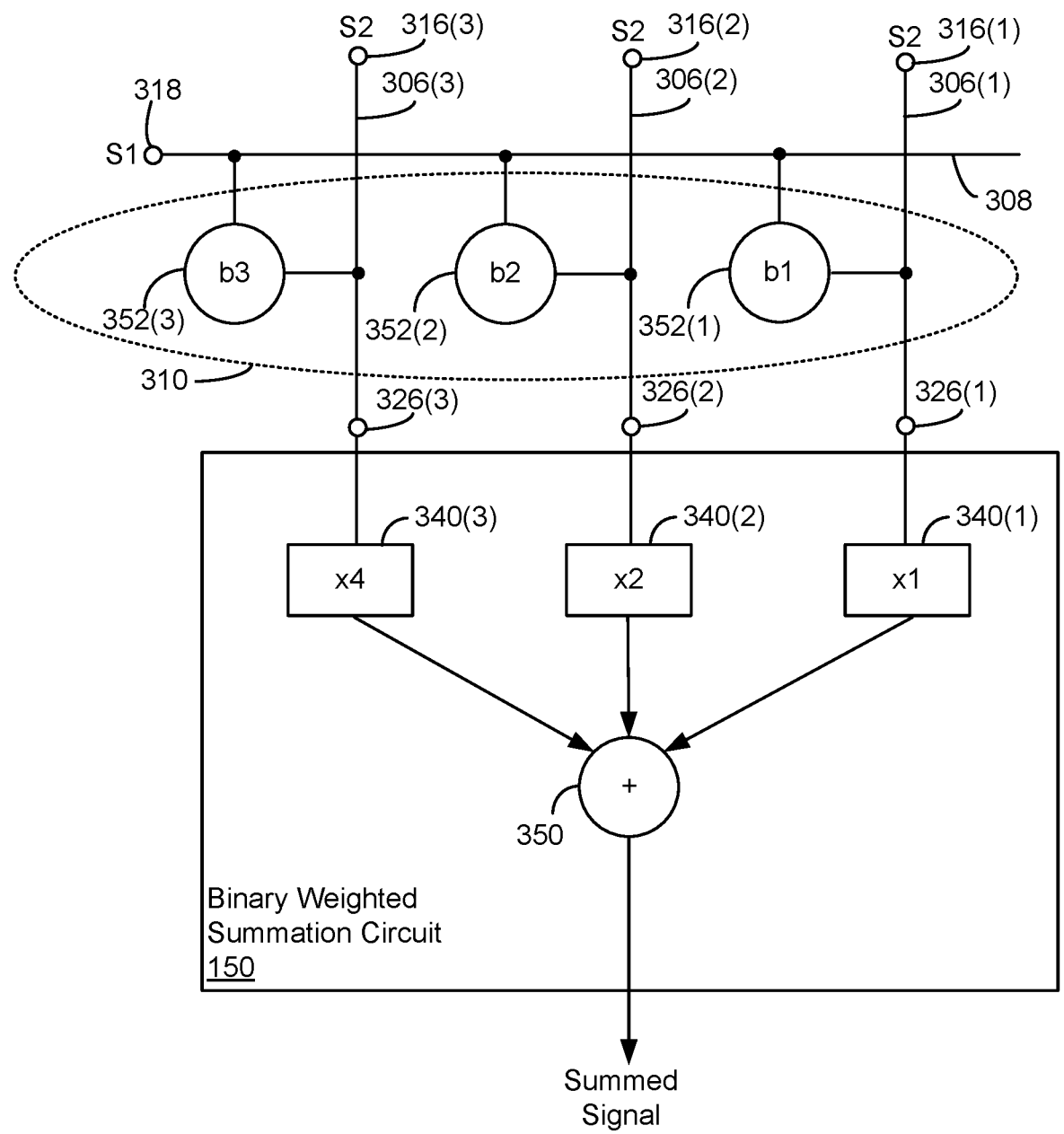
FIG. 3A depicts one embodiment of an apparatus that may be used to perform multiplication using a crossbar memory array.

FIG. 3A depicts one embodiment of an apparatus 300 that may be used to perform multiplication. The apparatus 300 may comprise circuitry and be included in a non-volatile storage device. The apparatus is contained within memory system 100, in one embodiment. The apparatus resides on memory chip 106, in one embodiment. FIG. 3A shows one node 310 in a cross-point memory array. The cross-point memory array typically has additional nodes 310. For example, there may be rows and columns of nodes 310. In the embodiment, there are three memory cells 352(1), 352(2), 352(3) in the node 310. The reference numeral 352 may be used to refer to a memory cell without reference to a specific memory cell. In general, there may be two or more memory cells 352 per each node 310.

Each memory cell 352 is electrically connected to first conductive line 308. In one embodiment, first conductive line 308 is referred to as a word line. There is a set of second conductive lines 306(1), 306(2), 306(3). The reference numeral 306 may be used to refer to a second conductive without reference to a specific line. In one embodiment, the second conductive lines 306 are referred to as bit lines. Each memory cell 352 in the node 310 is electrically connected to a different second conductive line 306. Each memory cell 352 is programmed to one of two different states, in one embodiment. For the sake of discussion, one state may be referred to as "0" and the other state as "1". Thus, it may be stated that each memory cell 352 stores one bit. In one embodiment, each memory cell 352 has an adjustable resistor, and the two different states are two different resistances (or alternatively conductances). In one embodiment, each memory cell 352 has a transistor with an adjustable threshold voltage, and the two different states are two different transistor threshold voltages.

A node 310 is a unit of two or more memory cells 352 that may be used to multiply two mathematical values. One mathematical value is stored in the node 310, and the other mathematical value is represented by a voltage applied to the memory cells 352 in the node. The memory cells 352 in the node 310 may be used to collectively store a mathematical value, in one embodiment. In one embodiment, the memory cells 352 in the node 310 collectively store a multiplicand. The multiplicand may be a weight in a neural network. In one embodiment, each memory cell 352 in the node 310 represents a different position in a binary number system. For example, memory cell 352(1) may represent the "1s" position, memory cell 352(2) may represent the "2s" position, and memory cell 352(3) may represent the "4s" position. Thus, the memory cells in the node 310 may collectively store three bits of information, in one embodiment.

The number of memory cells 352 in a node 310 relates to the resolution, in one embodiment. For example, the multiplicand may be a value between 0 and 1, such that with three bits the node 310 can represent the following values (0, 0.125, 0.25, 0.375, 0.5, 0.625, 0.75, 0.825). Adding more memory cells 352 to the node 310 can achieve greater resolution for the multiplicand over the same range. The range between 0 and 1 is just one example, as are the example values within the range.

The multiply circuit 146 is configured to apply a multiply voltage to each memory cell. The phrase, "apply a multiply voltage to a memory cell," or the like, may refer to application of the multiply voltage across two terminals of the memory cell. Moreover, applying a multiply voltage to a memory cell results in a memory cell current that has a magnitude that depends on the physical state (e.g., resistance, Vt) of the memory cell and the magnitude of the multiply voltage. In one embodiment, the magnitude of the memory cell current is a function of the resistance of an adjustable resistor in the memory cell and the magnitude of the multiply voltage. In one embodiment, the magnitude of the memory cell current is a function of the Vt of a transistor in the memory cell and the magnitude of the multiply voltage.

The multiply voltage may be applied between the first conductive line 308 and one of the second conductive lines 306 in order to apply the multiply voltage to a memory cell, in the embodiment of FIG. 3A. The first conductive line 308 has a first terminal 318 to which the multiply circuit 146 applies a first signal S1. Each of the second conductive lines 306 has a second terminal 316(1), 316(2), 316(3). The multiply circuit 146 applies a second signal S2 to each of the second terminals 316(1), 316(2), 316(3). Typically, the magnitude of the second signal S2 is the same for each second conductive line 306(1), 306(2), 306(3) associated with the node 310 Also, in one embodiment, the voltage on the second conductive lines 306 is a select voltage, which is also fixed voltage. By fixed voltage in this context it is meant that all of the second conductive lines 306 that are selected have the same magnitude voltage applied thereto. Thus, in one embodiment, the voltage on the first conductive line 308 is varied in order to apply the multiply voltage. Thus, the multiply circuit 146 may apply a voltage between two terminals of each memory cell (e.g., the difference between S1 and S2). In one embodiment, the voltage difference between S1 and S2 is the same for each memory cell 352 in the node 310.

In one embodiment, the magnitude of the multiply voltage represents a multiplier. Thus, the same multiplier may be applied to each memory cell 352 in the node 310. The apparatus 300 multiplies the multiplier by a multiplicand that is collectively stored in the memory cell 352 in the node 310, in one embodiment. Each memory cell 352 passes a memory cell current in response to the multiply voltage applied to that memory cell, in one embodiment. The memory cell current may be passed to the second conductive line 306. Each memory cell 352 causes a current (referred to as a memory cell current) in the second conductive line 306 in response to the multiply voltage applied to that memory cell, in one embodiment. Each memory cell 352 provides a current (referred to as a memory cell current) to the second conductive line 306 in response to the multiply voltage applied to that memory cell, in one embodiment. The memory cell current appears at a node 326 of a second conductive line. Thus, a first memory cell current for memory cell 352(1) flows at node 326(1), a second memory cell current for memory cell 352(2) flows at node 326(2), and a third memory cell current for memory cell 352(3) flows at node 326(3).

The binary weighted summation circuit 150 is configured to multiply and sum the magnitudes of the memory cell currents. Circuit 150 has three multipliers 340(1), 340(2), 340(3) and one current accumulator or summer 350. Reference numeral 340 may be used to refer to a multiplier without reference to a specific multiplier. Each multiplier 340 multiplies a magnitude of a memory cell current by a different power of two, in one embodiment. The powers of two include two raised to the zeroth power, in one embodiment. Thus, multiplication by "1" is included in the concept of multiplication by a different power of two. In the example of FIG. 3A, the powers of two are $2^0$, $2^1$, and $2^2$. Thus, the powers of two start at $2^0$ and progress consecutively to higher powers, in one embodiment. In one embodiment, when there are "r" memory cells 352 in the node 310, the powers start at $2^0$ and end at $2^{(r-1)}$.

As noted above, the magnitude of the multiply voltage may represent a multiplier. In one embodiment, each memory cell 352 stores one digit of a multiplicand. The multiplication by the differ powers of two is what enables each memory cell 352 to store a different digit of the multiplicand, in one embodiment. Thus, each memory cell 352 can be programmed to one of two states. In one embodiment, the magnitude of the memory cell current from each memory cell 352 represents a product of the multiplier by the digit of the multiplicand stored in the particular memory cells.

Multiplying the magnitudes of the memory cell currents by a different power of two may result in multiplied signals. The multiplied signals are currents, in one embodiment. The multiplied signals are digital values, in one embodiment. The multiplied signals are summed by summer 350. In one embodiment, the three multipliers 340(1), 340(2), 340(3) multiply the magnitude of a current, and the summer sums the magnitudes of the three multiplied currents. Binary weighted summation circuit 150 outputs a summed signal from the summer 350. The summed signal represents a product of the multiplier times a multiplicand stored in the node 310.

The way in which the summed signal is analyzed and used may depend on the application. The summed signal may be an analog signal, in one embodiment. In one embodiment, the summed signal may be input to an analog-to-digital converter (A/D), which may generate a multi-bit signal whose value reflects the magnitude of the summed signal. Thus, the multi-bit signal is the product of the multiplier and the multiplicand, in one embodiment. However, it is not required that the summed signal be converted to a digital signal. In one embodiment, a sense amplifier is used to compare the magnitude of the summed signal to a reference current. The sense amplifier may output a signal (e.g., one bit of information) that indicates whether the magnitude of the summed signal is less than or greater than the reference current. In one embodiment, the magnitude of the summed signal may be input to an activation function in an artificial neural network. In some applications, the activation function outputs a "fire" or "don't fire" signal based on the magnitude of the summed signal.

In one embodiment, the binary weighted summation circuit 150 is configured to simultaneously multiply the magnitude of the memory cell current from each memory cell 352 in the node 310 and sum the magnitudes of the multiplied memory cell currents for the selected node 310. The memory cell current from each memory cell 352 is an analog signal, in one embodiment. The binary weighted summation circuit 150 comprises analog circuitry, such as current mirrors, to perform current multiplication and current summing, in one embodiment. The simultaneous operation avoids delays that could otherwise be incurred by converting analog memory cell currents to digital signals, in order to process the memory cell currents. Note that herein a phrase such as "multiply a current" includes inputting a current into analog circuitry (e.g., a current mirror), which passes an output current having a magnitude that is based on the magnitude of the input current.

The apparatus 300 provides for very precise multiplication. For many memory cells, the memory cells can be reliably programmed to one of two physical states, where the physical state has precise physical value. For example, a memory cell with an adjustable resistor can be programmed to either a high resistance state or a low resistance state, wherein there may be relatively little cell to cell variation in the resistance of the high resistance state, and relatively little cell to cell variation in the resistance of the low resistance state. The terms "high resistance state" and "low resistance state," when used together means that the high resistance state has a higher resistance than the low resistance state. In one embodiment, the low resistance state is referred to as a "SET" state and the high resistance is referred to as a "RESET" state. As another example, a memory cell with an adjustable transistor threshold voltage can be programmed to either a high threshold voltage state or a low threshold voltage state, wherein there may be relatively little cell to cell variation in the threshold voltage of the high threshold voltage state, and relatively little cell to cell variation in the threshold voltage of the low threshold voltage. The terms "high threshold voltage state" and "low threshold voltage state," when used together means that the high threshold voltage state has a higher threshold voltage than the low threshold voltage state. Thus, each memory cell 352 should pass a similar memory cell current when it is in the low physical state (e.g., low resistance or low threshold voltage). Likewise, each memory cell 352 should pass a similar memory cell current when it is in the high physical state (e.g., high resistance or high threshold voltage). Moreover, the binary weighted summation circuit 150 can precisely multiply by one of the powers of two, in one embodiment. Hence, the summed signal may represent multiplication of the multiplier and the multiplicand. In one embodiment, each memory cell 352 is a three-terminal device.

Figure 3B:
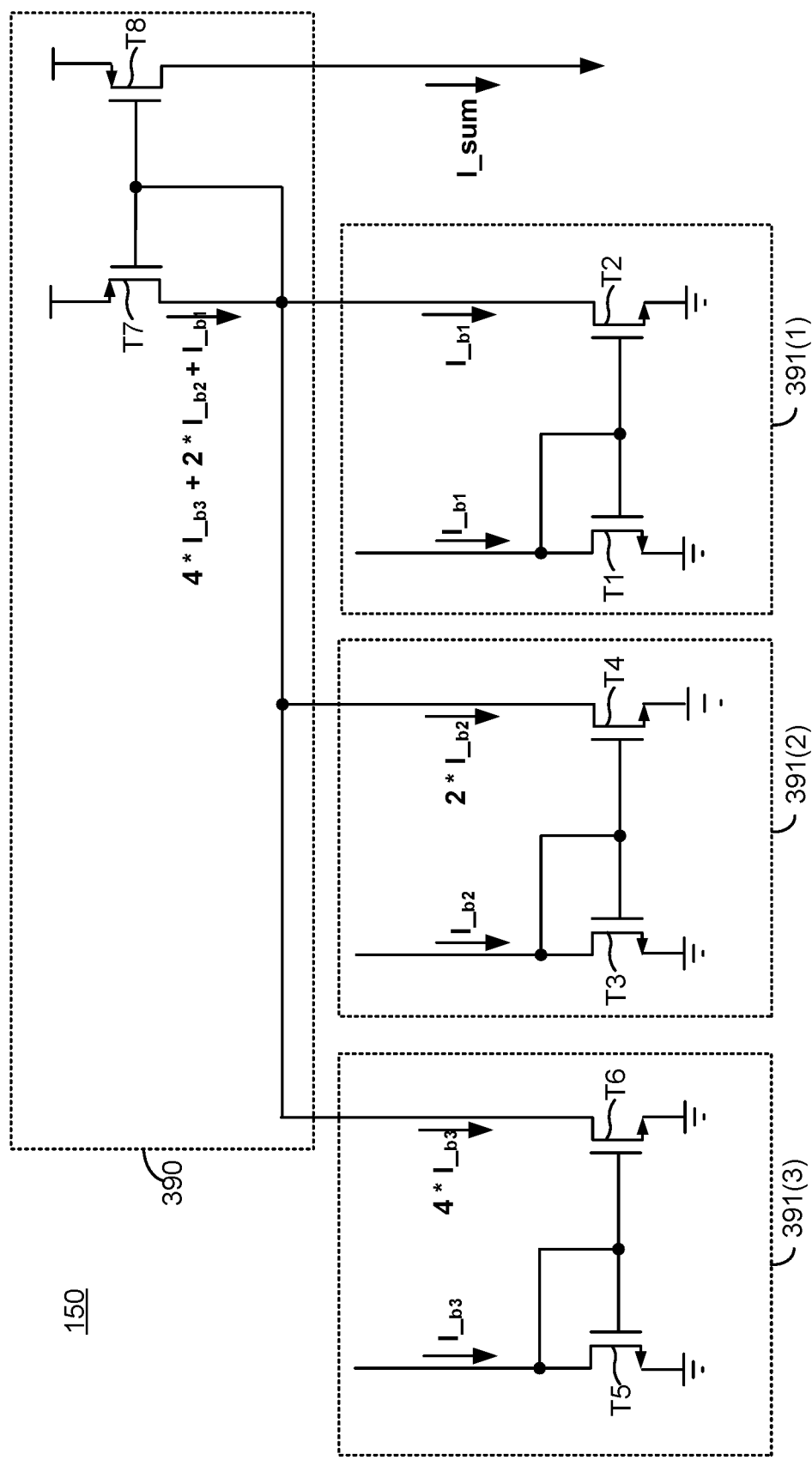
FIG. 3B depicts one embodiment of the binary weighted summation circuit.

FIG. 3B depicts one embodiment of the binary weighted summation circuit 150 depicted in FIG. 3A. The circuit 150 has a first multiply current mirror 391(1) that may be used to implement multiplier 340(1), second multiply current mirror 391(3) that may be used to implement multiplier 340(2), and third multiply current mirror 391(3) that may be used to implement multiplier 340(3). The circuit 150 also has a summing current mirror 390 that may be used to implement the summer 350 depicted in FIG. 3A. The first, second, and third multiply current mirrors 391(1), 391(2) and 391(3) each receive a current from one of the second conductive lines 306 associated with a column of nodes 310. The first multiply current mirror 391(1) has transistor T1 and transistor T2. The second current mirror 391(2) has transistor T3 and transistor T4. The third current mirror 391(3) has transistor T5 and transistor T6. The fourth current mirror 391(4) has transistor T7 and transistor T8. In one embodiment, transistors T1, T2, T3, T5, T7, and T8 are each the same size. Transistors T1, T2, T3, T5, T7, and T8 each have the same width-to-length ratio (W/L), in one embodiment. However, transistor T4 may have twice the W/L of transistors T1, T2, T3, T5, T7, and T8. Further, transistor T6 may have four times the W/L of transistors T1, T2, T3, T5, T7, and T8.

Figure 3C:
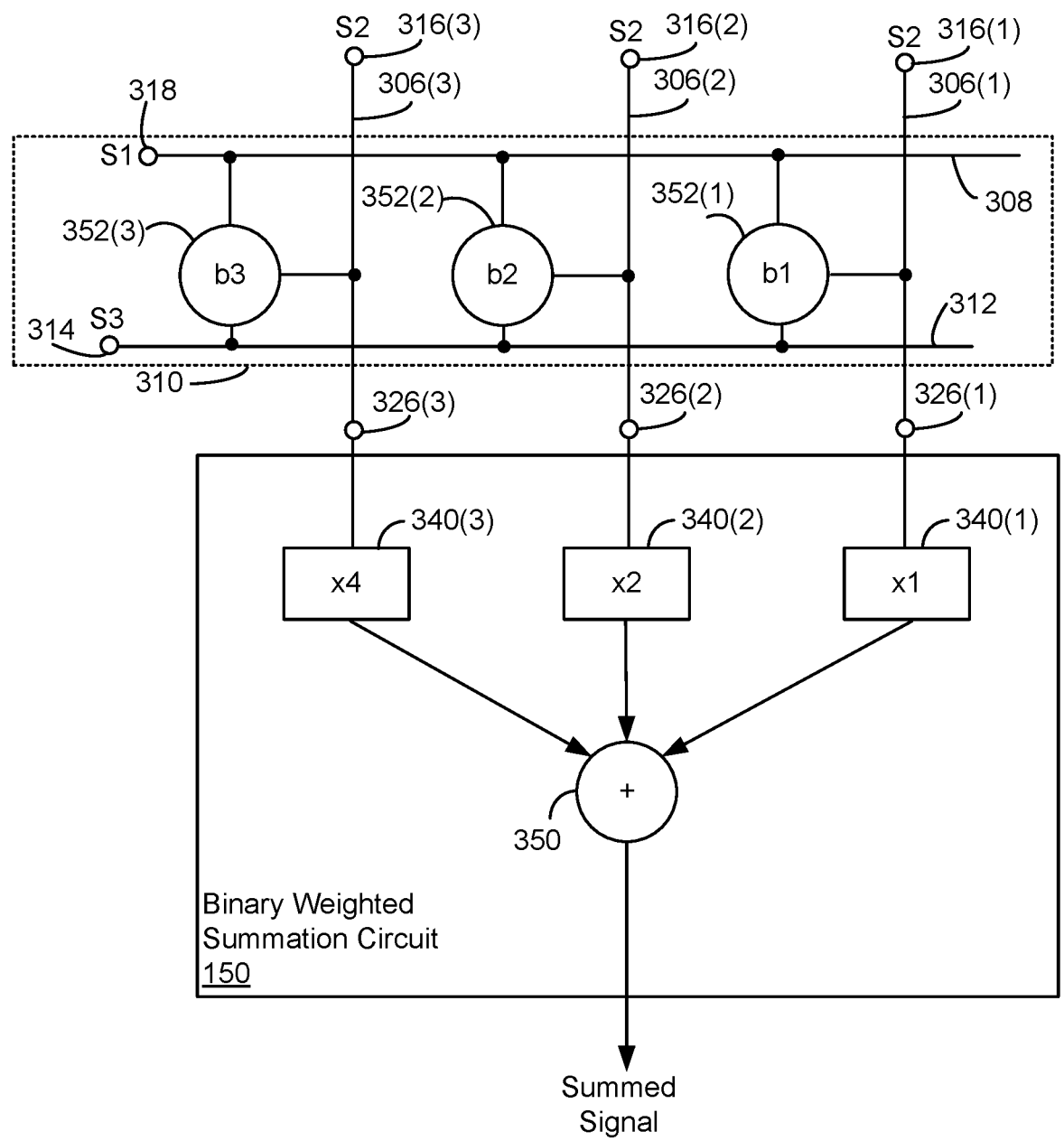
FIG. 3C depicts one embodiment of an apparatus that may be used to perform multiplication using a crossbar memory array.

FIG. 3C depicts one embodiment of an apparatus 301 that may be used to perform multiplication wherein each memory cell 352 is a three-terminal memory device. The three-terminal architecture adds a third conductive line 312 in addition to a first conductive line 308 and second conductive lines 306. In one embodiment, the third conductive line 312 is referred to as a source line. A voltage S3 may be applied to a source terminal 314 of the source line 312.

Some three-terminal memory cells have a transistor. In some embodiments, the gate terminal of the transistor is connected to the first conductive line 308. The gate terminal of the transistor is provided with a fixed voltage during one embodiment of a multiplication operation. By a "fixed voltage" it is meant that when there are more nodes in the array, each first conductive line 308 that is selected receives the same magnitude voltage. Also, in one embodiment, the voltage on the second conductive lines 306 is a select voltage (to select memory cells connected to the second conductive line 306), which is also a fixed voltage. By this it is meant that all of the second conductive lines 306 that are selected have the same magnitude voltage applied thereto. Thus, in one embodiment, the voltage on the third conductive line 312 is varied in order to apply the multiply voltage to a memory cell 352.

A three-terminal memory cell may respond to the multiply voltage by producing a memory cell current that has a magnitude that depends on the physical state (e.g., resistance, Vt) of the memory cell. The memory cell current may depend on the voltage across two of the three terminals. For one type of three-terminal memory cell, the memory cell current may depend on the voltage between the first conductive line 308 and third conductive line 312. Thus, the multiply voltage is applied between the first conductive line 308 and third conductive line 312, in one embodiment. For another type of three-terminal memory cell, the memory cell current may depend on the voltage between the second conductive line 308 and the third conductive line 312. Thus, the multiply voltage is applied between the second conductive line 308 and the third conductive line 308, in one embodiment. A wide variety of non-volatile memory cells can be used in the memory nodes 310.

Figure 4A:
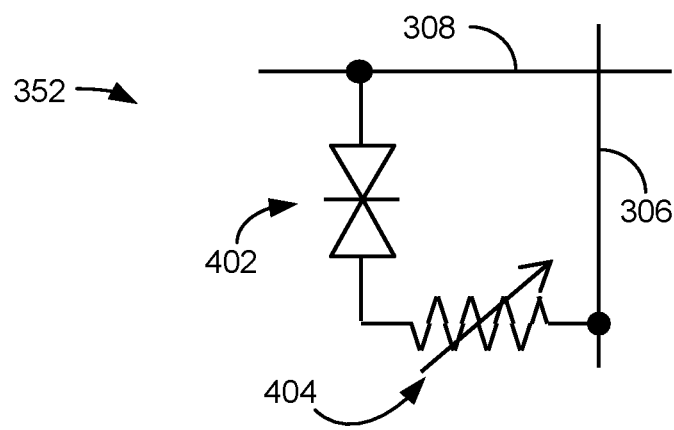
FIGS. 4A-4C depict various embodiment of memory cells within a crossbar memory array.

FIG. 4A depicts one embodiment of a two-terminal memory cell that may be used in one embodiment of FIG. 3A. In this example, the two-terminal device has a selector 402 and an adjustable resistor 404. The adjustable resistor 404 may be any reversible resistance-switching material. The reversible resistance-switching material can be repeatedly switched between at least a first state and a second state. The first state may be a high resistance state and the second state may be a low resistance state. The high resistance state is a low current (or off) state, in one embodiment. The low resistance state is a high current (or on) state, in one embodiment. Example reversible resistance-switching material include a phase change material, a ferroelectric material, a metal oxide (e.g., hafnium oxide), a barrier modulated switching structure, or other similar reversible resistance-switching materials. The selector 402 may be a diode, which may be used to reduce leakage currents. The selector 402 is sometimes referred to as a steering element or as an isolation element.

One terminal of the two-terminal device is connected to the first conductive line 308. The other terminal is connected to the second conductive line 306. In the depicted configuration, the selector 402 is directly connected to the first conductive line 308 and the adjustable resistor 404 is directly connected to the second conductive line 306. However, in another configuration, the selector 402 is directly connected to the second conductive line 306 and the adjustable resistor 404 is directly connected to the first conductive line 308. In one embodiment, a multiply voltage is applied between first conductive line 308 and second conductive line 306 during a multiplication operation. The current in the second conductive line 306 depends on the magnitude of the multiply voltage and the resistance of the adjustable resistor 404, in one embodiment. In one embodiment, there is a linear relationship between the magnitude of the multiply voltage and the on-current of the memory cell 352.

Figure 4B:
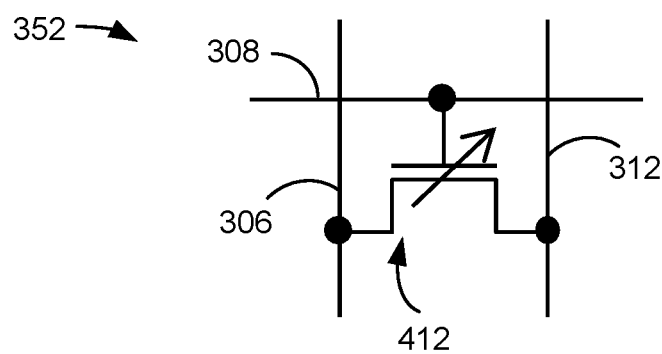
Figure 4C:
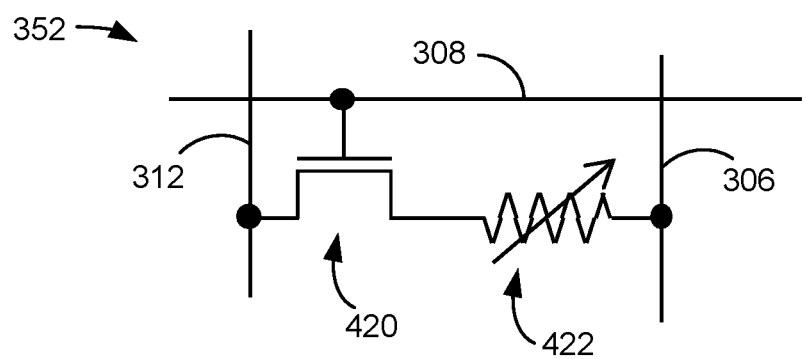

In some embodiments, the memory cells 352 in a node 310 are three-terminal memory cells. FIGS. 4B-4C show two example three-terminal memory cells 352.

FIG. 4B depicts one embodiment of a three-terminal device having an adjustable threshold voltage (Vt) transistor 412 that has an adjustable threshold voltage. In one embodiment, the adjustable Vt transistor 412 has a low threshold voltage state and a high threshold voltage state. The high Vt state is a low current (or off) state, in one embodiment. The low Vt state is a high current (or on) state, in one embodiment. The adjustable Vt transistor 412 can be repeatedly switched between the low threshold voltage state and the high threshold voltage state. A first terminal (transistor gate) of the adjustable Vt transistor 412 is connected to the first conductive line 308. A second terminal of the adjustable Vt transistor 412 is connected to the second conductive line 306. The third terminal of the adjustable Vt transistor 412 is connected to the third conductive line 312. In one embodiment, the first conductive line 308 provides a fixed voltage to the gate of the transistor 412 during the multiplication operation. In one embodiment, the voltage to the gate of the adjustable Vt transistor 412 is tuned such that the adjustable Vt transistor 412 operates in the linear regime. If the gate voltage is greater than the sum of the maximum voltage on the third conductive line 312 and the maximum Vt of the adjustable Vt transistor 412, then the adjustable Vt transistor 412 operates in the linear regime, in one embodiment.

FIG. 4C depicts one embodiment of three-terminal device, which may be used as a memory cell 352. In this example, the three-terminal device has an access transistor 420 and an adjustable resistor 422. The adjustable resistor 422 may be any reversible resistance-switching material. The reversible resistance-switching material can be repeatedly switched between at least a first state and a second state. The first state may be a high resistance state and the second state may be a low resistance state. The high resistance state is a low current (or off) state, in one embodiment. The low resistance state is a high current (or on) state, in one embodiment. Example reversible resistance-switching materials include a phase change material, a ferroelectric material, a metal oxide (e.g., hafnium oxide), a barrier modulated switching structure, or other similar reversible resistance-switching materials. Access transistor 420 is a field effect transistor (FET), in one embodiment. Access transistor 420 is a bipolar junction transistor (BJT), in one embodiment.

A first (transistor gate) terminal of the memory cell 352 in FIG. 4C is connected to the first conductive line 308. A second terminal is connected to the second conductive line 306. The third terminal of the memory cell 352 is connected to the third conductive line 312. In one embodiment, the first conductive line 308 provides a fixed voltage to the gate of the access transistor 420 during the multiplication operation. In one embodiment, a multiply voltage is applied between second conductive line 306 and third conductive line 312 during a multiplication operation. The current in the second conductive line 306 depends on the magnitude of the multiply voltage and the resistance of the adjustable resistor 422, in one embodiment. In one embodiment, there is a linear relationship between the magnitude of the multiply voltage and the on-current of the memory cell 352.

Figures 5A, 5B, 5C:
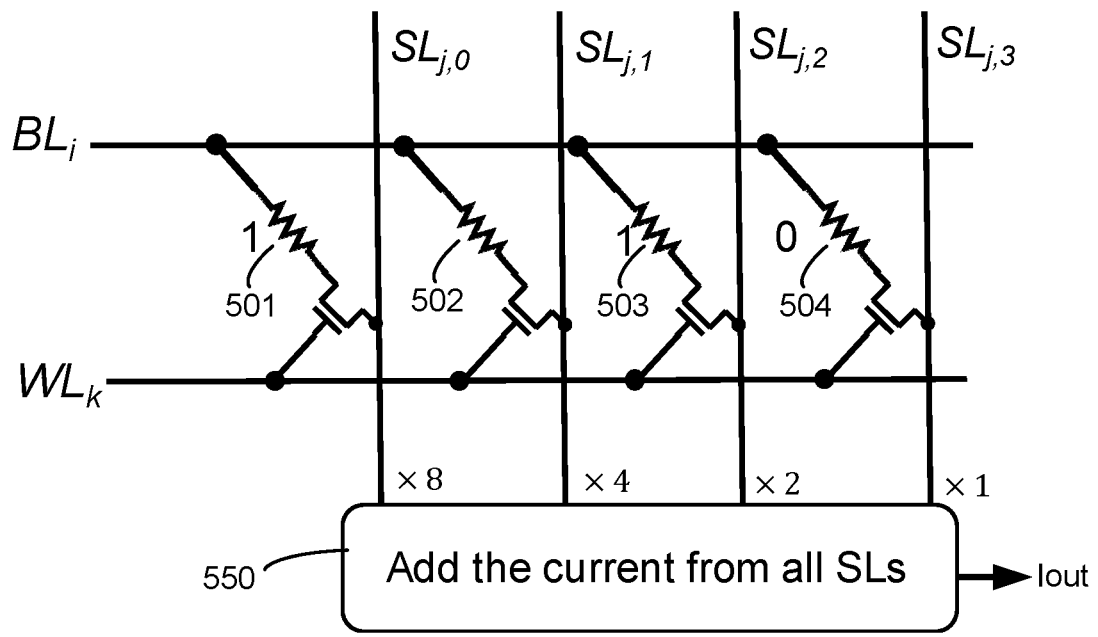
FIG. 5A depicts one embodiment of a group of memory cells corresponding with a node.
FIG. 5B depicts one embodiment of an equation describing the aggregation of currents by a current summation circuit in which the memory cell 502 of FIG. 5A has been programmed into a non-conducting state corresponding with a resistance of 1M ohm.
FIG. 5C depicts one embodiment of an equation describing the aggregation of currents by a current summation circuit in which the memory cell 502 of FIG. 5A has a short defect with a resistance of 1 ohm.

FIG. 5A depicts one embodiment of a group of memory cells 501-504 corresponding with a node, such as node 310 in FIG. 3A. The group of memory cells may correspond with a row of memory cells or a portion of a row of memory cells within a cross-point memory array. In one example, each row in the cross-point memory array may comprise eight different nodes. The group of memory cells includes memory cell 502 corresponding with an adjustable resistor. The memory cell 502 may comprise a two terminal memory cell. The resistance of the memory cell 502 may be programmed to be in a conducting state (e.g., with a resistance of 1K ohm or less) or may be programmed to be in a non-conducting state (e.g., with a resistance of 1M ohm or greater). Each memory cell in the group of memory cells is connected to a bit line $BL_i$ on the drain side. The gates of the access transistors in series with each memory cell are connected to a word line $WL_k$. The sources of the access transistors are connected to different source lines. For example, the source of the access transistor in series with memory cell 502 is connected to source line $SL_{J,1}$. The currents in the source lines $SL_{J,0}$ through $SL_{J,3}$ are aggregated using a current summation circuit 550. One example of the current summation circuit 550 is the summation circuit 150 depicted in FIGS. 3A-3C.

FIG. 5B depicts one embodiment of an equation describing the aggregation of currents by the current summation circuit 550 in which the memory cell 502 has been programmed into a non-conducting state corresponding with a resistance 513 of 1M ohm. The non-conducting state may correspond with a logic "0" and the conducting state may correspond with a logic "1." As depicted, the aggregated current from the programming of the memory cell 501 into a conducting logic "1" state, the programming of the memory cell 502 into a non-conducting logic "0" state, the programming of the memory cell 503 into a conducting logic "1" state, and the programming of the memory cell 504 into a non-conducting logic "0" state is 1.005 mA.

FIG. 5C depicts one embodiment of an equation describing the aggregation of currents by the current summation circuit 550 in which the memory cell 502 has a short defect with a resistance 514 of 1 ohm. In some cases, a physical short may manifest itself over time as the memory cell 502 is stressed during prior operations. The resistance (e.g., 1 ohm) of the short defect may be significantly less than the resistance (e.g., 1K ohm) of a resistor set into the conducting state. As depicted, the aggregated current with the short defect is very close to 4A with the short defect current dominating the aggregated current. Therefore, the short defect may cause a substantial error in the aggregated current values.

FIG. 6A depicts one embodiment of a group of memory cells 601-604 corresponding with a node, such as node 310 in FIG. 3A, in which a local word line gating unit 652 is used to control the selection of the local word line $LWL_{k,0}$. A current summation circuit 650 aggregates memory cell currents from the group of memory cells 601-604. One example of a current summation circuit is depicted in FIG. 3B. In one embodiment, if the local word line gating unit 652 has been configured to enable selection of the local word line $LWL_{k,0}$ during an operation, then when the global word line $GWL_k$ has been set to a selected word line voltage (e.g., 3V), then the local word line $LWL_{k,0}$ will also be set to the selected word line voltage, thereby setting the access transistors for the group of memory cells 601-604 into a conducting state; however, if the local word line gating unit 652 has been configured to disable selection of the local word line $LWL_{k,0}$ during the operation, then when the global word line $GWL_k$ has been set to the selected word line voltage, then the local word line $LWL_{k,0}$ will not be set to the selected word line voltage and instead will be set to a disabling voltage or 0V, thereby setting the access transistors for the group of memory cells 601-604 into a non-conducting state. If the access transistors for the group of memory cells 601-604 are set into the non-conducting state, then no current will flow through the access transistors.

FIG. 6B depicts one embodiment of a local word line gating unit, such as the local word line gating unit 652 in FIG. 6A. The local word line gating unit includes a non-volatile memory element 651, a PMOS transistor 653, an NMOS transistor 655, and an NMOS transistor 654. The non-volatile memory element 651 comprises an adjustable resistor with a resistance $R_G$. As depicted, if the global word line $GWL_k$ is set to an unselected word line voltage (e.g., 0V), then the NMOS transistor 655 is cut off and the NMOS transistor 654 pulls down the local word line LWL to 0V or ground. Instead, if the global word line $GWL_k$ is set to a selected word line voltage (e.g., 3V), then the NMOS transistor 654 is cut off, the NMOS transistor 655 is set into a conducting state, and the PMOS transistor 653 is set into a conducting state; in this case, the voltage of the local word line LWL will depend upon the sizing of the PMOS transistor 653, the NMOS transistor 655, and the resistance of the non-volatile memory element 651. Due to transistor sizing, the PMOS transistor 653 may be made much weaker than the NMOS transistor 655. For example, the W/L for the PMOS transistor 653 may be 1/2 and the W/L for the NMOS transistor 655 may be 8/1. If the non-volatile memory element 651 has been set into a low resistance state or a disabling state, then the local word line may be pulled close to ground or 0V in order to set the access transistors for the group of memory cells 601-604 into a non-conducting state even though the global word line $GWL_k$ has been selected. However, if the non-volatile memory element 651 has been set into a high resistance state or an enabling state, then the local word line may be set close to the selected word line voltage VWL (e.g., 3V) in order to set the access transistors for the group of memory cells 601-604 into a conducting state.

FIG. 6C depicts another embodiment of a local word line gating unit, such as the local word line gating unit 652 in FIG. 6A. The local word line gating unit includes a non-volatile memory element 651, an NMOS transistor 657, an NMOS transistor 655, and an NMOS transistor 654. One benefit of using an NMOS transistor in the pull up path to charge the local word line LWL towards the selected word line voltage VWL is that the layout area may be reduced. The non-volatile memory element 651 comprises an adjustable resistor with a resistance $R_G$. As depicted, if the global word line $GWL_k$ is set to an unselected word line voltage (e.g., 0V), then the NMOS transistors 655 and 657 are cut off and the NMOS transistor 654 pulls down the local word line LWL to 0V or ground. If the global word line $GWL_k$ is set to a selected word line voltage (e.g., 3V), then the NMOS transistor 654 is cut off, the NMOS transistor 655 is set into a conducting state, and the NMOS transistor 657 is set into a conducting state; in this case, the voltage of the local word line LWL will depend upon the sizing of the NMOS transistor 657, the NMOS transistor 655, and the resistance of the non-volatile memory element 651. Due to transistor sizing, the NMOS transistor 657 may be made much weaker than the NMOS transistor 655. For example, the W/L for the NMOS transistor 657 may be 1/4 and the W/L for the NMOS transistor 655 may be 8/1. Similar to the operation of the local word line gating unit depicted in FIG. 6B, if the non-volatile memory element 651 has been set into a low resistance state or a disabling state, then the local word line LWL may be pulled close to ground or 0V in order to set the access transistors for the group of memory cells 601-604 into a non-conducting state. However, if the non-volatile memory element 651 has been set into a high resistance state or an enabling state, then the local word line LWL may be set close to the selected word line voltage VWL in order to set the access transistors for the group of memory cells 601-604 into a conducting state.

In some embodiments, the local word line gating unit may include a flip flop that may be set to and store a logic "0" when the local word line gating unit is set into a disabling state. The output of the flip-flop may drive the control input of an analog multiplexor in order to select between outputting the global word line voltage or a disabling voltage, such as 0V. Therefore, if the flip flop is set into the disabling state, then the analog multiplexor may select the disabling voltage instead of the global word line voltage. However, if the flip flop is set into the enabling state, then the analog multiplexor may select the global word line voltage causing the access transistors for the group of memory cells 601-604 to be placed into a conducting state during an operation.

Figure 6D:
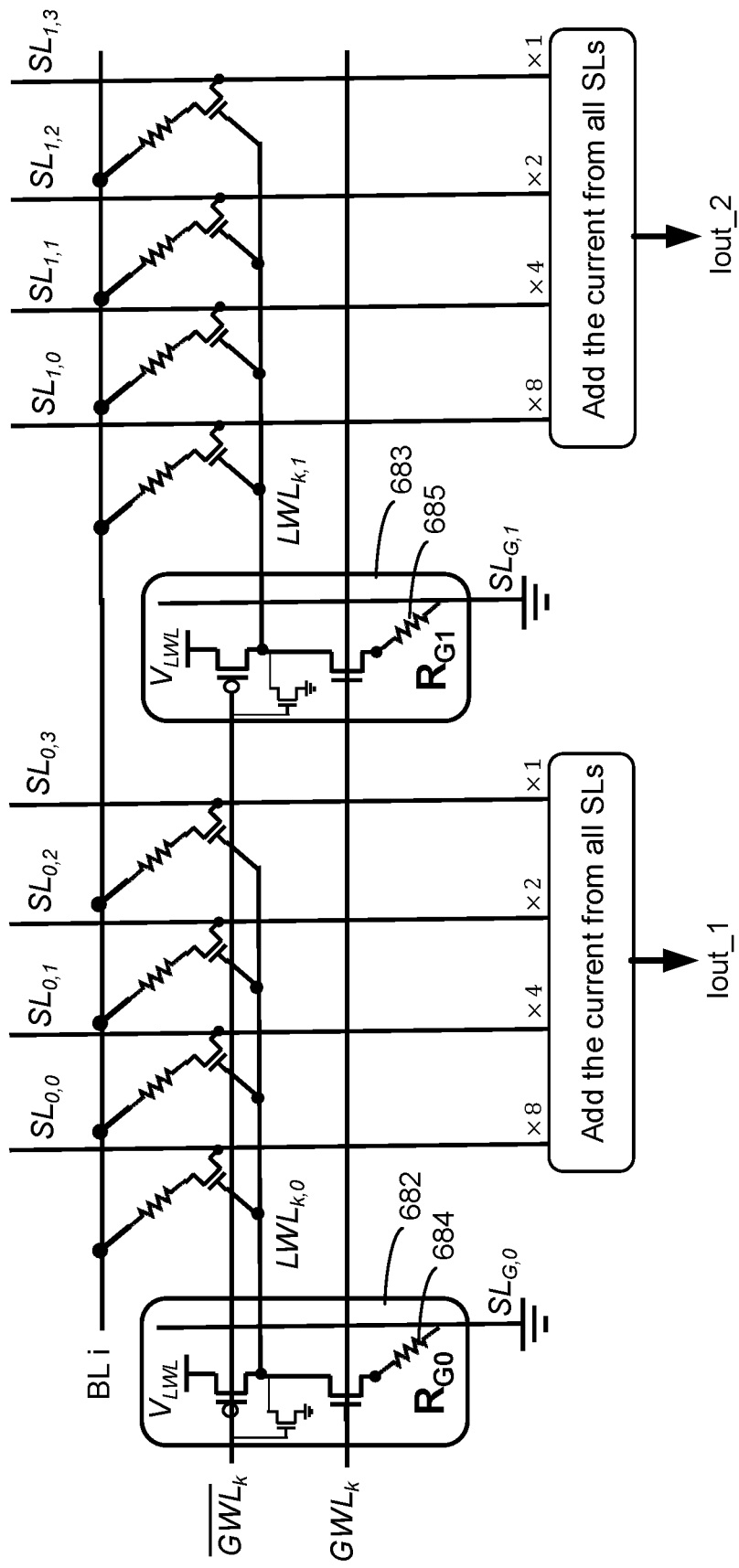
FIG. 6D depicts one embodiment of two nodes controlled by two different local word line gating units.

FIG. 6D depicts one embodiment of two nodes controlled by two different local word line gating units 682 and 683. As depicted, the global word line $GWL_k$ connects to both local word line gating units 682 and 683. The local word line gating unit 682 includes a non-volatile memory element 684 that has been set into a high resistance non-conducting state ($R_{G0}$) and the local word line gating unit 683 includes a non-volatile memory element 685 that has been set into a low resistance conducting state ($R_{G1}$). During a multiplication operation when the global word line $GWL_k$ is set to a selected word line voltage (e.g., 3V), the local word line $LWL_{k,0}$ that is connected to the first group of memory cells may be biased to a voltage close to the selected word line voltage VLWL while the local word line $LWL_{k,1}$ that is connected to the second group of memory cells may be biased to a voltage close to ground, thereby setting the access transistors in series with the second group of memory cells into a non-conducting state.

In one embodiment, a cross point memory array may include a row with a first set of memory cells and a second set of memory cells. A global word line may connect to a first local word line gating unit and a second local word line gating unit. The first local word line gating unit may control a first local word line connected to access transistors for the first set of memory cells and the second local word line gating unit may control a second local word line connected to access transistors for the second set of memory cells.

During a multiplication operation, the global word line may be set to a selected word line voltage (e.g., 3V), the second local word line may be set to a disabling voltage (e.g., 0V), and the first local word line may be set to an enabling voltage (e.g., 3V). In this case, the aggregate current for the first set of memory cells may be greater than the aggregate current for the second set of memory cells.

Figure 7A:
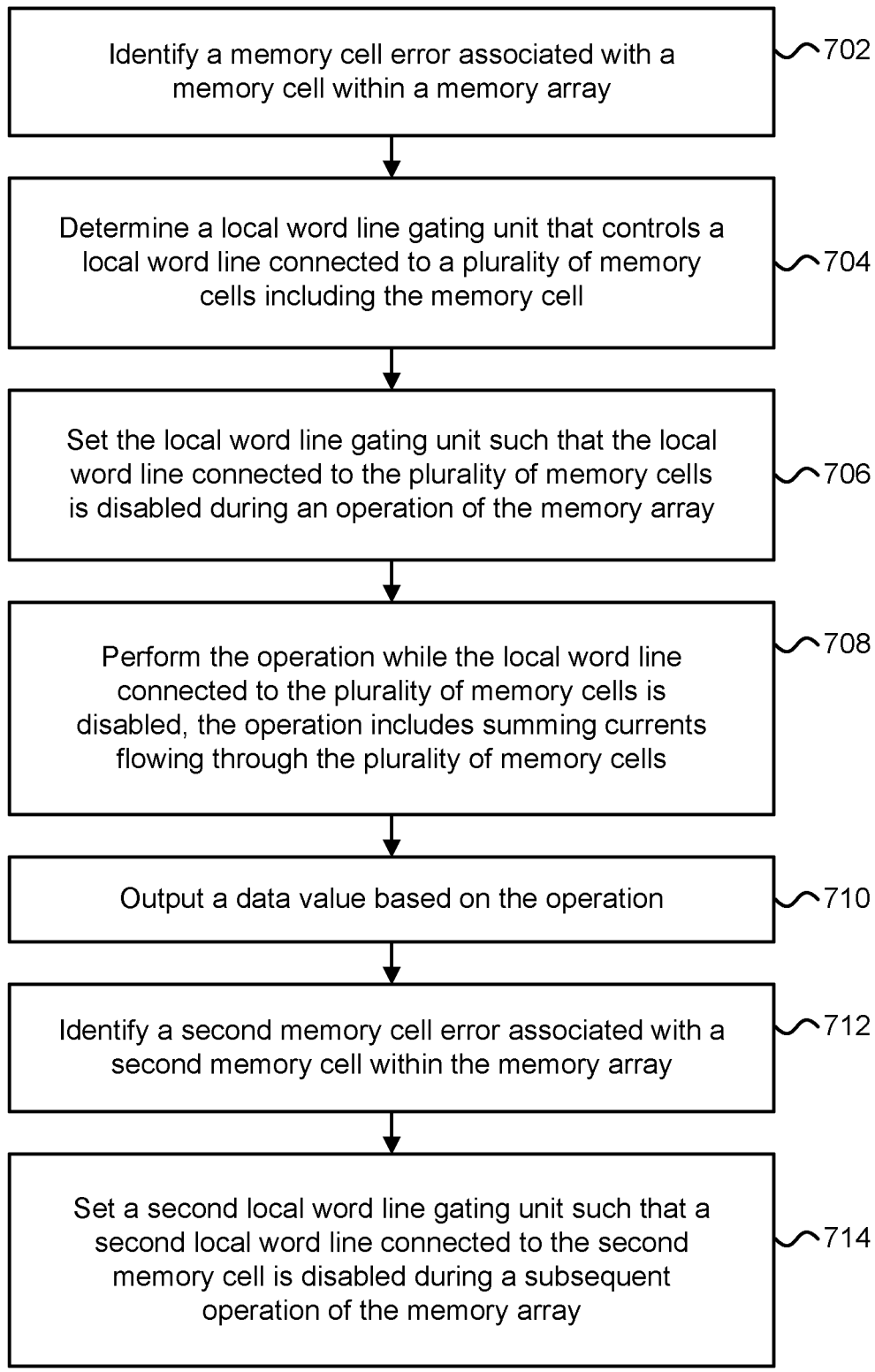
FIG. 7A is a flowchart describing one embodiment of a process for performing an operation using a crossbar memory array.

FIG. 7A is a flowchart describing one embodiment of a process for performing an operation using a crossbar memory array. In one embodiment, the process of FIG. 7A may be performed by a memory chip controller, such as the memory chip controller 104 depicted in FIG. 1A, or be performed by one or more control circuits arranged on a memory chip, such as memory chip 106 in FIG. 1A. Portions of the process of FIG. 7A may be performed by electronic circuits, such as those depicted in FIGS. 3A-3C and FIGS. 6A-6D.

In step 702, a memory cell error associated with a memory cell within a memory array is identified. The memory cell error may be associated with a memory array defect or short within the memory array. The memory array defect may be identified during wafer sort or prior to shipment of an integrated circuit that includes the memory array by performing a test procedure that identifies abnormal currents within the memory array or that identifies leakage currents that are greater than a threshold amount of current. In one example, the memory cells within the memory array may be programmed into a non-conducting state or into a high resistance state and the memory array may test for memory cell currents greater than the threshold amount of current (e.g., greater than 0.1 mA) while the memory cells are in the non-conducting state. In one embodiment, the memory cell error associated with the memory cell may be identified after shipment of the integrated circuit or after user operations have been performed using the memory array. In one example, a periodic checking for memory array shorts may be performed (e.g., every hour) in order to identify shorts that have developed over time due to memory operations being performed using the memory array. The memory array defect may impact a particular group of memory cells within the memory array. The memory cell error may be associated with a location within the memory array corresponding with the memory cell.

In step 704, a local word line gating unit that controls a local word line connected to a plurality of memory cells including the memory cell is determined. In one example, a lookup table may be used to map a particular address or location corresponding with the memory cell to the local word line gating unit. One example of a local word line gating unit is the local word line gating unit 652 in FIG. 6A.

In step 706, the local word line gating unit is set such that the local word line connected to the plurality of memory cells is disabled during an operation of the memory array. The operation of the memory array may comprise a multiplication operation or a matrix multiplication operation. In one example, the local word line connected to the plurality of memory cells may be disabled by setting a configuration bit, programming a non-volatile memory element, or programming a volatile memory element (e.g., a latch). After the local word line is disabled, the local word line gating unit may prevent the local word line from being biased to a voltage that would set access transistors connected to the local word line into a conducting state during the operation.

In step 708, the operation is performed while the local word line connected to the plurality of memory cells is disabled. The operation may include summing currents flowing through the plurality of memory cells. In one example, the operation may comprise a multiplication operation in which source line currents are aggregated and either the aggregated current is outputted or a data value associated with the aggregated current is outputted. In step 710, a data value is outputted based on the operation. In one example, the data value may comprise a binary data value associated with a multiplication operation.

In step 712, a second memory cell error associated with a second memory cell different from the memory cell is identified within the memory array. In this case, subsequent to outputting the data value at step 710, a test program for identifying newly developed shorts within the memory array may be performed to identify the second memory cell error. In step 714, a second local word line gating unit is set such that a second local word line connected to the second memory cell is disabled during a subsequent operation of the memory array. During the subsequent operation of the memory array, both the local word line connected to the plurality of memory cells and the second local word line connected to the second memory cell may be disabled such that the access transistors connected to the disabled local word lines remain in a non-conducting state during the subsequent operation.

Figure 7B:
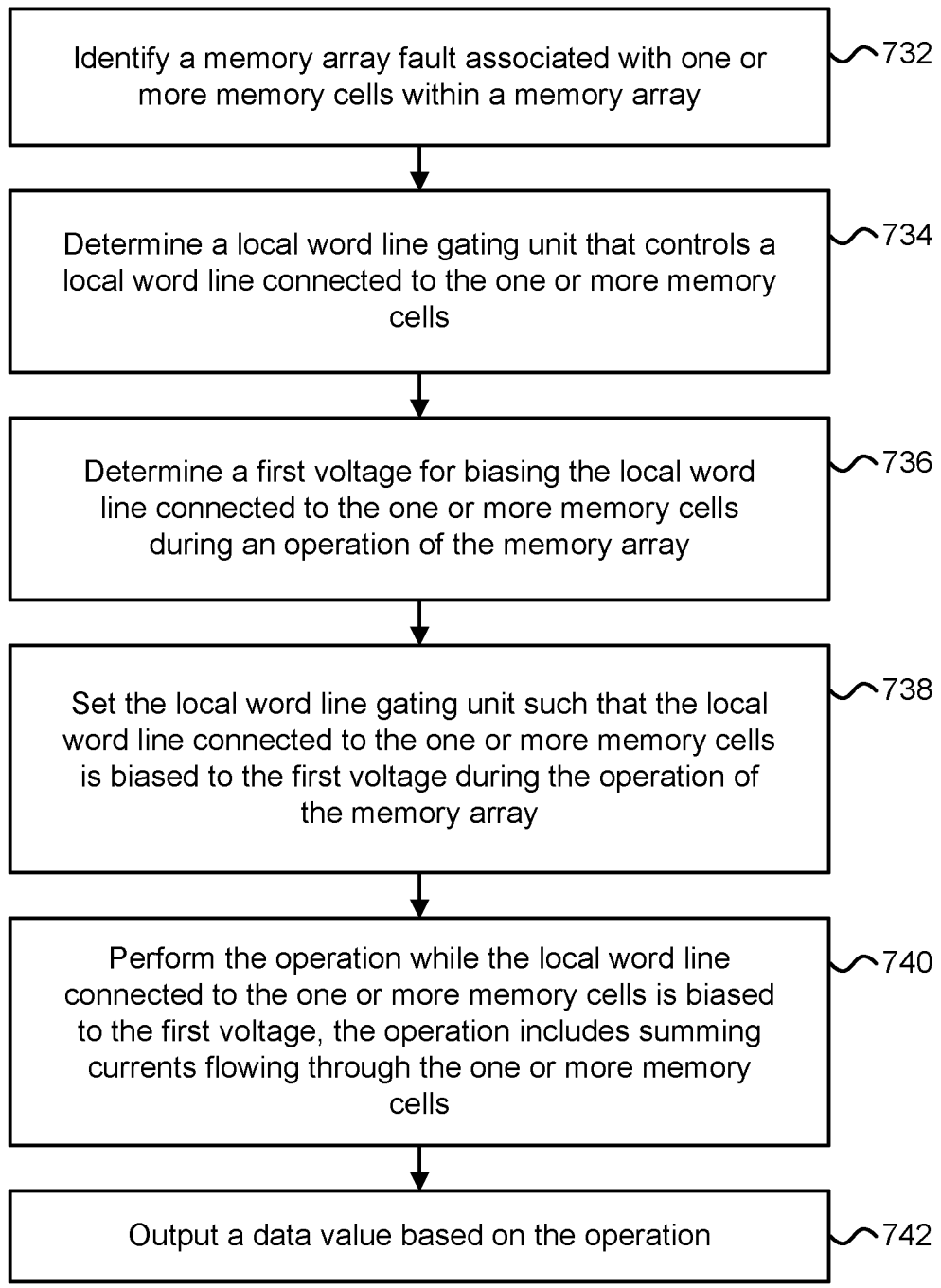
FIG. 7B is a flowchart describing an alternative embodiment of a process for performing an operation using a crossbar memory array.

FIG. 7B is a flowchart describing an alternative embodiment of a process for performing an operation using a crossbar memory array. In one embodiment, the process of FIG. 7B may be performed by a memory chip controller, such as the memory chip controller 104 depicted in FIG. 1A, or be performed by one or more control circuits arranged on a memory chip, such as memory chip 106 in FIG. 1A. Portions of the process of FIG. 7B may be performed by electronic circuits, such as those depicted in FIGS. 3A-3C and FIGS. 6A-6D.

In step 732, a memory array fault associated with one or more memory cells within a memory array is identified. The memory array fault may correspond with a short within the memory array. The memory array fault may be identified by performing a row short or memory cell short test in which memory array control lines are biased while memory cells have been programmed into a non-conducting state and currents are sensed in order to detect leakage currents above a current threshold. In step 734, a local word line gating unit that controls a local word line connected to the one or more memory cells is determined. The local word line gating unit or circuit may output the local word line. The local word line may connect to access transistors in series with the one or more memory cells instead of directly connecting to the one or more memory cells. One example of a local word line gating unit is the local word line gating unit 652 in FIG. 6A and one example of the one or more memory cells is the group of memory cells 601-604 in FIG. 6A. The local word line gating unit may be determined or identified via a lookup table that maps a location associated with the memory array fault to the local word line gating unit. In one example, the memory array fault may correspond with a row or a portion of a row within the memory array and the local word line gating unit may comprise the local word line gating unit that controls the local word line for the row or the portion of the row within the memory array.

In step 736, a first voltage for biasing the local word line connected to the one or more memory cells during an operation of the memory array is determined. In one example, the first voltage may comprise 0V or a voltage that guarantees that access transistors in series with the one or more memory cells will be placed into a non-conducting state during the operation of the memory. In step 738, the local word line gating unit is set or configured such that the local word line connected to the one or more memory cells is biased to the first voltage during the operation of the memory array. In step 740, the operation is performed while the local word line connected to the one or more memory cells is biased to the first voltage. The operation may comprise or include summing currents flowing through the one or more memory cells. In step 742, a data value is outputted based on the operation. In one example, the data value may be outputted based on an aggregated current value for the currents flowing through the one or more memory cells.

One embodiment of the disclosed technology includes a first plurality of memory cells, a first plurality of access transistors arranged in series with the first plurality of memory cells, a current summation circuit, and a local word line gating circuit configured to set a local word line connected to gates of the first plurality of access transistors to a first voltage during a multiplication operation based on a state of a storage element within the local word line gating circuit. The current summation circuit configured to aggregate memory cell currents from the first plurality of memory cells during the multiplication operation while the local word line is set to the first voltage.

One embodiment of the disclosed technology includes a identifying an electrical short associated with a first plurality of memory cells within a memory array, determining a local word line gating circuit that controls a local word line connected to access transistors in series with the first plurality of memory cells in response to identifying the electrical short, determining a first voltage for biasing the local word line during an operation of the memory array, configuring the local word line gating circuit such that the local word line is biased to the first voltage during the operation of the memory array, and performing the operation while the local word line is biased to the first voltage. The operation includes aggregating currents flowing through the first plurality of memory cells. The method further comprises outputting a data value based on the aggregation of the currents flowing through the first plurality of memory cells during the operation.

One embodiment of the disclosed technology includes a first plurality of memory cells, a second plurality of memory cells, a bit line connected to each memory cell of the first plurality of memory cells and the second plurality of memory cells, a first plurality of access transistors arranged in series with the first plurality of memory cells, a second plurality of access transistors arranged in series with the second plurality of memory cells, a local word line gating circuit configured to set a local word line connected to the first plurality of access transistors to a first voltage during a multiplication operation, a current summation circuit configured to aggregate memory cell currents from the first plurality of memory cells during the multiplication operation while the local word line is set to the first voltage, a second local word line gating circuit configured to set a second local word line connected to gates of the second plurality of access transistors to a second voltage different from the first voltage during the multiplication operation, and a second current summation circuit configured to aggregate memory cell currents from the second plurality of memory cells during the multiplication operation while the second local word line is set to the second voltage.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
   a first plurality of memory elements;
   a first plurality of access transistors, each access transistor arranged in series with a respective memory element of the first plurality of memory elements;
   a local word line gating circuit configured to set a local word line connected to gates of the first plurality of access transistors to a first voltage during a multiplication operation based on a state of a storage element within the local word line gating circuit; and
   a current summation circuit in communication with the first plurality of access transistors, the current summation circuit configured to multiply memory element currents from the first plurality of memory elements by different respective multipliers and aggregate the multiplied memory element currents from the first plurality of memory elements during the multiplication operation while the local word line is set to the first voltage.

2. The apparatus of claim 1, wherein:
   the current summation circuit configured to multiply a first current from a first memory element of the first plurality of memory elements by two times and multiply a second current from a second memory element of the first plurality of memory elements by four times prior to aggregating the memory element currents.

3. The apparatus of claim 1, further comprising:
   a second plurality of memory elements;
   a second plurality of access transistors arranged in series with the second plurality of memory elements;
   a second local word line gating circuit configured to set a second local word line connected to gates of the second plurality of access transistors to a second voltage different from the first voltage during the multiplication operation; and a second current summation circuit configured to aggregate memory element currents from the second plurality of memory elements during the multiplication operation while the second local word line is set to the second voltage.

4. The apparatus of claim 3, wherein:
the local word line gating circuit configured to determine the first voltage based on a voltage applied to a global word line; and
the second local word line gating circuit configured to determine the second voltage based on the voltage applied to the global word line.

5. The apparatus of claim 3, further comprising:
a bit line connected to the first plurality of memory elements and the second plurality of memory element.

6. The apparatus of claim 1, wherein:
the first voltage sets each transistor of the first plurality of access transistors into a non-conducting state during the multiplication operation.

7. The apparatus of claim 1, further comprising:
one or more control circuits configured to identify an electrical short within the first plurality of memory elements and set the state of the storage element within the local word line gating circuit to a disabling state in response to identification of the electrical short.

8. The apparatus of claim 1, wherein:
the current summation circuit comprises a plurality of current mirrors; and
the first plurality of memory elements comprises non-volatile memory elements.

9. The apparatus of claim 1, wherein:
the storage element of the local word line gating circuit comprises a non-volatile storage element.

10. The apparatus of claim 1, wherein:
the storage element is a volatile storage element; and
the local word line gating circuit includes an analog multiplexor controlled by the volatile storage element.

11. A method, comprising:
identifying an electrical short associated with a first plurality of memory elements within a memory array, the first plurality of memory elements including at least a first memory element and a second memory element;
determining a local word line gating circuit that controls a local word line connected to access transistors in series with the first plurality of memory elements in response to identifying the electrical short;
determining a first voltage for biasing the local word line during an operation of the memory array;
configuring the local word line gating circuit such that the local word line is biased to the first voltage during the operation of the memory array;
performing the operation while the local word line is biased to the first voltage, the operation includes multiplying currents flowing through the first plurality of memory elements by different respective multipliers to obtain multiplied currents including multiplying a first current of the currents from the first memory element by two, multiplying a second current of the currents from the second memory element by four, and aggregating the multiplied currents; and
outputting a data value based on the multiplication and aggregation of the currents flowing through the first plurality of memory elements during the operation.

12. The method of claim 11, wherein:
configuring the local word line gating circuit includes configuring the state of a storage element.

13. The method of claim 11, further comprising:
configuring a second local word line gating circuit such that a second local word line is biased to a second voltage different from the first voltage during the operation of the memory array, the local word line gating circuit determines the first voltage based on a voltage applied to a global word line and the second local word line gating circuit determines the second voltage based on the voltage applied to the global word line.

14. The method of claim 11, wherein:
the first voltage sets each of the access transistors in series with the first plurality of memory elements into a non-conducting state during the operation.

15. The method of claim 11, wherein:
the local word line gating circuit includes a non-volatile storage element; and
the operation comprises a multiplication operation.

16. An apparatus, comprising:
a first plurality of memory elements;
a second plurality of memory elements;
a bit line connected to each memory element of the first plurality of memory elements and the second plurality of memory elements;
a first plurality of access transistors arranged in series with the first plurality of memory elements;
a second plurality of access transistors arranged in series with the second plurality of memory elements;
a first local word line gating circuit configured to set a first local word line connected to the first plurality of access transistors to a first voltage during a multiplication operation;
a first current summation circuit configured to multiply memory element currents from the first plurality of memory elements by different respective multipliers and aggregate the multiplied memory element currents from the first plurality of memory elements during the multiplication operation while the first local word line is set to the first voltage;
a second local word line gating circuit configured to set a second local word line connected to gates of the second plurality of access transistors to a second voltage different from the first voltage during the multiplication operation; and
a second current summation circuit configured to multiply memory element currents from the second plurality of memory elements by different respective multipliers and aggregate the multiplied memory element currents from the second plurality of memory elements during the multiplication operation while the second local word line is set to the second voltage.

17. The apparatus of claim 16, wherein:
the first current summation circuit is configured to multiply a first current from a first memory element of the first plurality of memory elements by two times prior to aggregating the memory element currents from the first plurality of memory elements during the multiplication operation.

18. The apparatus of claim 16, wherein:
the local word line gating circuit configured to determine the first voltage based on a voltage applied to a global word line; and
the second local word line gating circuit configured to determine the second voltage based on the voltage applied to the global word line.

19. The apparatus of claim 16, wherein:
the first voltage sets each transistor of the first plurality of access transistors into a non-conducting state during the multiplication operation; and
the second voltage sets each transistor of the second plurality of access transistors into a conducting state during the multiplication operation.

20. The apparatus of claim 16, wherein:
the local word line gating circuit includes a non-volatile storage element and an analog multiplexor controlled by the non-volatile storage element.

* * * * *